(12) United States Patent
Chiang et al.

(10) Patent No.: US 11,935,966 B2
(45) Date of Patent: Mar. 19, 2024

(54) TRANSISTOR DEVICE HAVING ULTRAVIOLET ATTENUATING CAPABILITY

(71) Applicant: TAIWAN SEMICONDUCTOR MANUFACTURING COMPANY, LTD., Hsinchu (TW)

(72) Inventors: Katherine H. Chiang, Hsinchu (TW); Neil Quinn Murray, Hsinchu (TW); Ming-Yen Chuang, Hsinchu (TW); Chung-Te Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 343 days.

(21) Appl. No.: 17/243,102

(22) Filed: Apr. 28, 2021

(65) Prior Publication Data
US 2022/0352385 A1 Nov. 3, 2022

(51) Int. Cl.
*H01L 29/786* (2006.01)
*H01L 29/423* (2006.01)

(52) U.S. Cl.
CPC .. *H01L 29/78696* (2013.01); *H01L 29/42384* (2013.01); *H01L 29/7869* (2013.01)

(58) Field of Classification Search
CPC ......... H01L 29/78696; H01L 29/42384; H01L 29/7869
See application file for complete search history.

(56) References Cited

U.S. PATENT DOCUMENTS 8,921,853 B2 * 12/2014 Yamazaki ......... H01L 29/66969
257/43
2016/0049524 A1 * 2/2016 Shen ................. H01L 29/78633
257/43

\* cited by examiner

*Primary Examiner* — Jonathan Han
(74) *Attorney, Agent, or Firm* — Birch, Stewart Kolasch & Birch, LLP

(57) ABSTRACT

A transistor device includes a first source/drain region and a second source/drain region spaced apart from each other; a channel layer electrically connected to the first and second source/drain regions; a gate insulator layer; a gate electrode isolated from the channel layer by the gate insulator layer; and a UV-attenuating layer disposed on the channel layer to protect the channel layer from characteristic degradation caused by UV light.

20 Claims, 34 Drawing Sheets

TRANSISTOR DEVICE HAVING ULTRAVIOLET ATTENUATING CAPABILITY

BACKGROUND

Thin film transistor (TFT) is a kind of metal-oxide-semiconductor field effect transistor (MOSFET), and may be used in a flat panel display as a switching transistor and in a static random access memory as a load device.

In manufacturing TFTs, oxide semiconductor materials, such as InGaZnO, InZnO, InGaO, and the like, are used to form a channel layer of TFT. Such oxide semiconductor materials and other wide band-gap oxide semiconductor materials are liable to characteristic degradation caused by ultraviolet (UV) light used in a UV curing process, which is an essential process for forming a low or very low k intermetal dielectric (IMD) layer in a back-end-of-line (BEOL) process for a current semiconductor manufacturing method.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
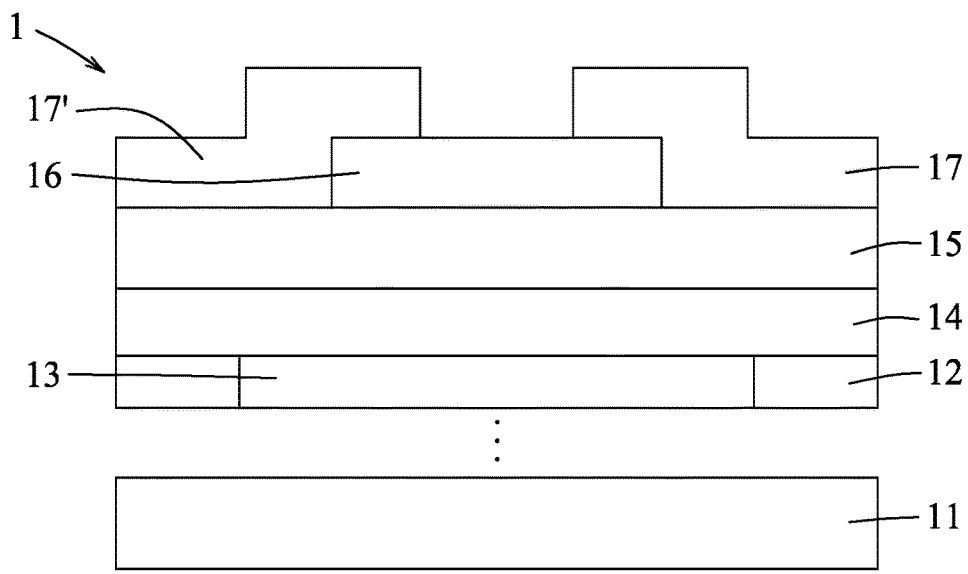
FIG. 1 illustrates a schematic view of a transistor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic view of a transistor device in accordance with some embodiments. A transistor device 1 is disposed on a substrate 11 and is a TFT device having a back gate configuration. The transistor device 1 includes a dielectric layer 12, a gate electrode 13, a high-k gate insulator layer 14, a channel layer 15, a UV-attenuating layer 16, a first source/drain region 17, and a second source/drain region 17'. The dielectric layer 12 is formed on the substrate 11. The gate electrode 13 is formed in the dielectric layer 12 and on the substrate 11. The high-k gate insulator layer 14 is formed on the dielectric layer 12 and the gate electrode 13. The channel layer 15 is formed on the high-k gate insulator layer 14, and is isolated from the gate electrode 13 by the high-k gate insulator layer 14. The UV-attenuating layer 16 is formed on the channel layer 15. The first and second source/drain regions 17, 17' are formed on the channel layer 15 and the UV-attenuating layer 16, and are spaced apart from each other. The channel layer 15 is electrically connected to the first and second source/drain regions 17, 17'.

Figure 2:
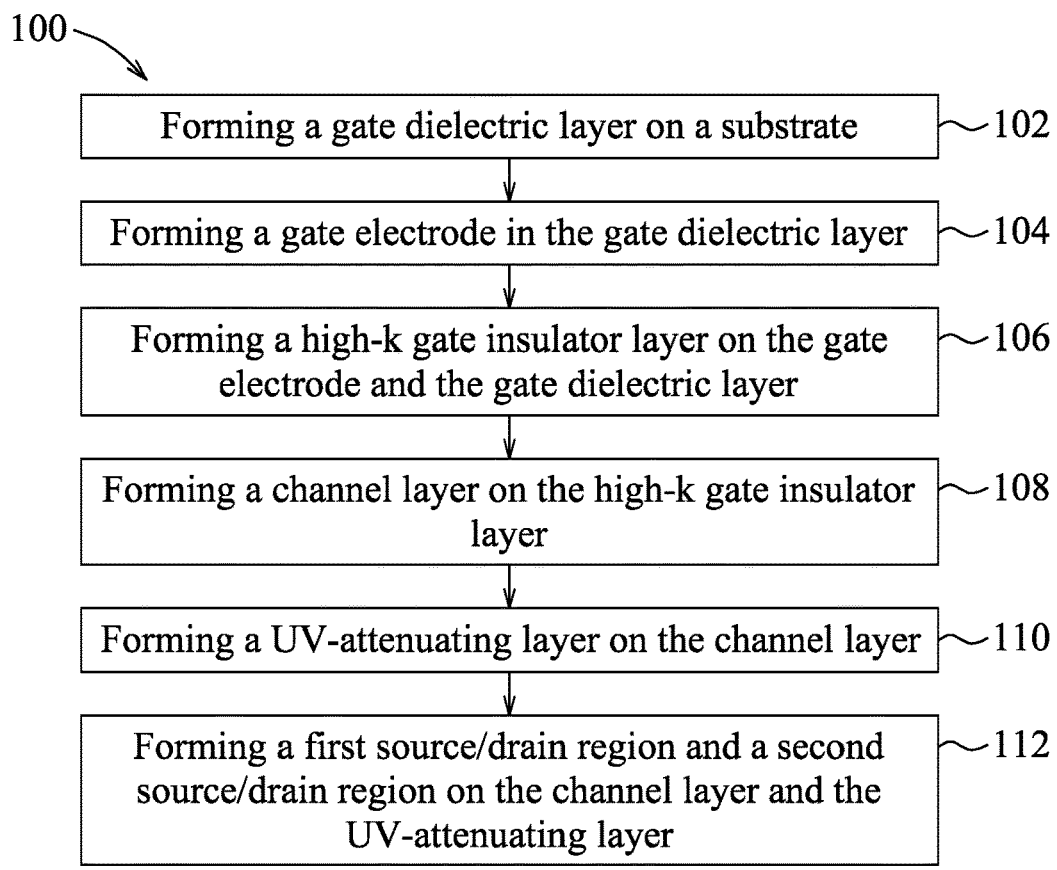
FIG. 2 is a flow diagram illustrating a method for manufacturing the transistor device as depicted in FIG. 1.
Figure 3:
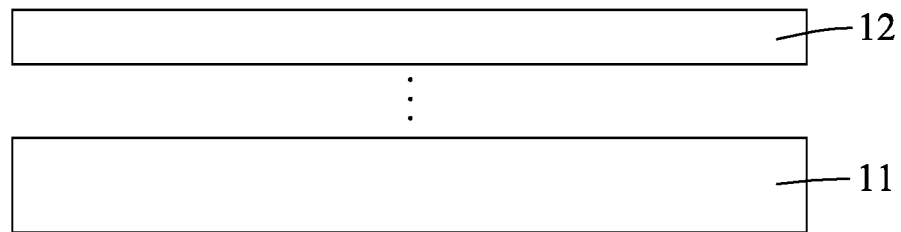
FIGS. 3 to 7 illustrate schematic views showing intermediate stages of the method as depicted in FIG. 2.
Figure 4:
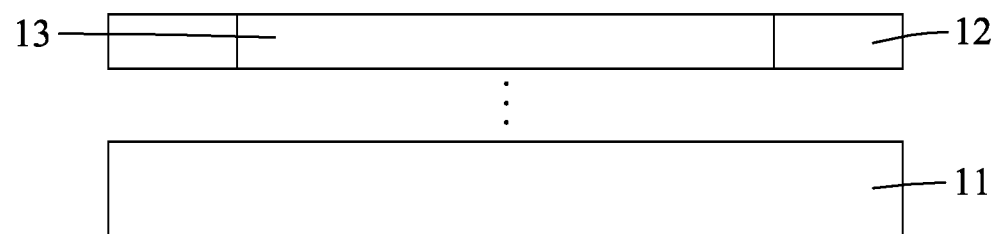
Figure 5:
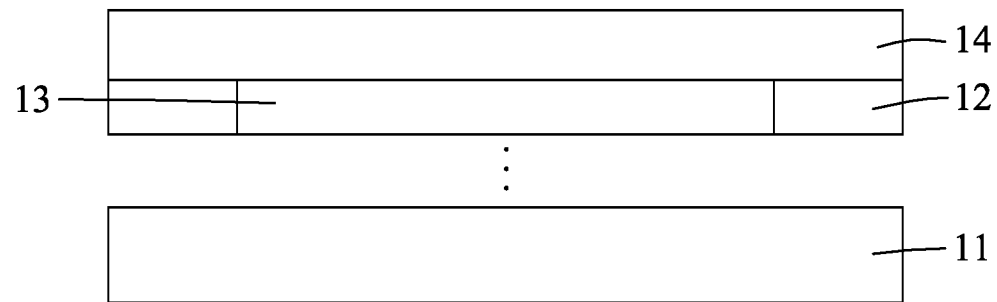
Figure 6:
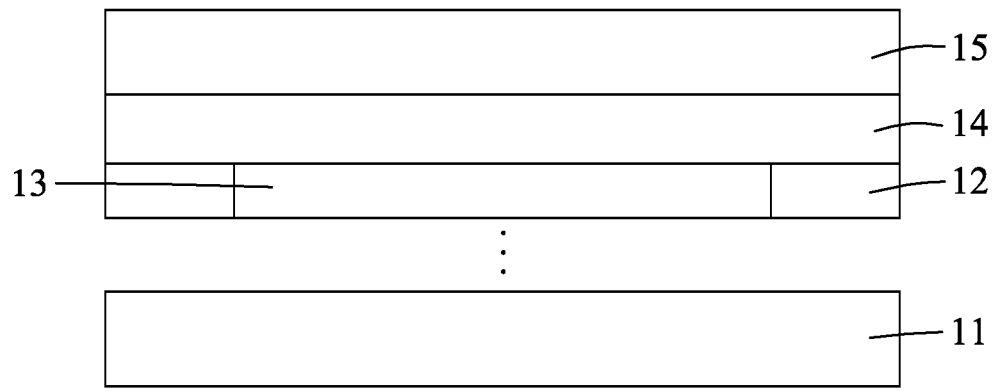
Figure 7:
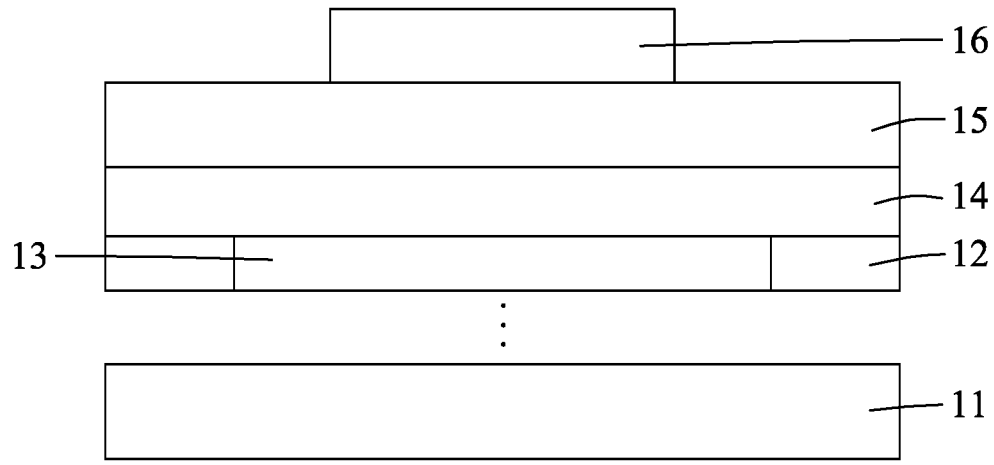

FIG. 2 illustrates a method 100 for manufacturing the transistor device 1 in accordance with some embodiments. FIGS. 3 to 7 illustrate schematic views showing intermediate stages of the method as depicted in FIG. 2. Additional steps can be provided before, after or during the method 100, and some of the steps described herein may be replaced by other steps or be eliminated. Similarly, further additional features may be present in the transistor device 1, and/or features present may be replaced or eliminated in additional embodiments.

Referring to FIG. 2, the method 100 begins at block 102, where a dielectric layer is formed on a substrate. Referring to the example illustrated in FIG. 3, the dielectric layer 12 is formed on the substrate 11. In some embodiments, the dielectric layer 12 may include, for example but not limited to, silicon oxide, silicon nitride, silicon oxynitride, or combinations thereof. The dielectric layer 12 may be formed by suitable fabrication techniques, such as atomic layer deposition (ALD), chemical vapor deposition (CVD), metalorganic CVD (MOCVD), physical vapor deposition (PVD), thermal oxidation, UV-ozone oxidation, remote plasma atomic layer deposition (RPALD), plasma-enhanced atomic layer deposition (PEALD), molecular beam deposition (MBD), or combinations thereof. In some embodiments, the dielectric layer 12 may have a thickness ranging from about 0.5 nanometer (nm) to about 10 nm.

In some embodiments, the substrate 11 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. In addition, the substrate 11 may be a bulk silicon substrate, a silicon-on-insulator (SOI) substrate, or a germanium-on-insulator (GOI) substrate. Other suitable materials are within the contemplated scope of disclosure.

Referring to FIG. 2, the method 100 then proceeds to block 104, where a gate electrode is formed in the dielectric layer. Referring to the example illustrated in FIG. 4, the gate electrode 13 is formed in the dielectric layer 12 and on the substrate 11. Specifically, the dielectric layer 12 is patterned by an etching technique through a patterned photoresist (not shown) to form an opening to expose a portion of the substrate 11. The etching technique may include wet etching, dry etching, or a combination thereof. The gate electrode 13 is then formed in the dielectric layer 12 and on the substrate 11 by depositing a conductive material to fill the opening and removing excess of the conductive material by a planarization technique, such as chemical mechanical planarization (CMP). In some embodiments, the conductive material may include, for example but not limited to, polysilicon, a silicide material, metal composites (such as WN, TiN, or TaN), metal (aluminum, zirconium, titanium, tungsten, tantalum, ruthenium, palladium, platinum, cobalt, nickel), or alloys thereof. Depositing may be performed by a suitable technique, such as CVD, plasma enhanced chemical vapor deposition (PECVD), ALD, or other suitable processes. The gate electrode 12 may have a thickness ranging from about 10 nm to about 100 nm.

Referring to FIG. 2, the method 100 then proceeds to block 106, where a high-k gate insulator layer is formed on the gate electrode and the dielectric layer. Referring to the example illustrated in FIG. 5, the high-k gate insulator layer 14 is formed on the dielectric layer 12 and the gate electrode 13 by depositing a high-k dielectric material. The high-k dielectric material is generally a dielectric material having a dielectric constant higher than 4, greater than about 12, greater than about 16, or even greater than about 20, and may include, for example but not limited to, hafnium oxide (HfO2), hafnium silicon oxide (HfSiO), hafnium tantalum oxide (HfTaO), hafnium titanium oxide (HMO), hafnium zirconium oxide (HfZrO), zirconium oxide, titanium oxide, aluminum oxide, or hafnium dioxide-alumina (HfO2-Al2O3). Depositing may be performed by a suitable technique, such as CVD, PECVD, ALD, or other suitable processes. The high-k gate insulator layer 14 may have a thickness ranging from about 1 nm to about 10 nm.

Referring to FIG. 2, the method 100 then proceeds to block 108, where a channel layer is formed on the high-k gate insulator layer. Referring to the example illustrated in FIG. 6, the channel layer 15 is formed on the high-k gate insulator layer 14. The channel layer 15 may be made of various semiconductor materials. In some embodiments, the material for making the channel layer 15 may include, for example but not limited to, InGaZnO, InGaO, InZnO, GaZnO, InO, GaO, ZnO, ZnInSnO, ZnInO, ZnSnO, InSnO, SnO, InWO, WO, or combinations thereof. In some embodiments, the channel layer 15 may be made of a single layer having one of the foregoing materials. In some alternative embodiments, the channel layer 15 may be made of a laminate structure of at least two of the foregoing materials of various constitutions. In some embodiments, the channel layer 15 may be doped with a dopant to achieve extra stability. In some embodiments, the channel layer 15 may be deposited by a suitable technique, such as CVD, ALD, PVD, PECVD, epitaxial growth, or the like. In some embodiments, the channel layer 15 may have a thickness ranging from about 1 nm to about 50 nm.

Referring to FIG. 2, the method 100 then proceeds to block 110, where a UV-attenuating layer is formed on the channel layer. Referring to the example illustrated in FIG. 7, the UV-attenuating layer 16 is formed on the channel layer 15 by suitable depositing and patterning techniques. The UV-attenuating layer 16 thus formed is in direct contact with a portion of the channel layer 15. The UV-attenuating layer 16 is made of a UV-attenuating material. In some embodiments, the UV-attenuating material may include, for example but not limited to, molybdenum oxide (MoOx), molybdenum-doped zinc oxide (Mo-doped ZnO), silicon nitride (SiN), InGaZnO:N, or combinations thereof. Depositing may be performed by a suitable technique, such as CVD, ALD, PVD, PECVD, or other suitable processes. Patterning may be performed by a suitable technique, such as wet etching, dry etching, or a combination thereof. In some embodiments, prior to formation of the UV-attenuating layer 16, a capping layer (not shown) may be formed on the channel layer 15 by depositing and patterning techniques, such that the capping layer is disposed between the channel layer 15 and the UV-attenuating layer 16 after formation of the UV-attenuating layer 16. The capping layer is used to protect the channel layer 15 from hydrogen atoms, which is known to damage the channel layer 15, generated during the manufacturing process of the transistor device 1. In some embodiments, the UV-attenuating layer 16 may have a thickness of not more than 100 nm.

Referring to FIG. 2, the method 100 then proceeds to block 112, where a first source/drain region and a second source/drain region are formed on the channel layer and the UV-attenuating layer. Referring to the example illustrated in FIG. 1, the first and second source/drain regions 17, 17' are formed on the channel layer 15 and the UV-attenuating layer 16 by depositing and patterning techniques. In some embodiments, a layer of semiconductor material is conformally deposited over the channel layer 15 to cover the UV-attenuating layer 16. The layer of semiconductor material is then patterned and ion implanted to form the first and second source/drain regions 17, 17' which are spaced apart from each other to define an opening therebetween to expose the UV-attenuating layer 16. In some embodiments, the semiconductor material may be made from, for example but not limited to, amorphous silicon or a semiconductor oxide, such as InGaZnO, InWO, InZnO, InSnO, GaOx, InOx and the like. Conformal depositing may be performed by a suitable technique, such as CVD, PECVD, ALD, or the like.

Figure 8:
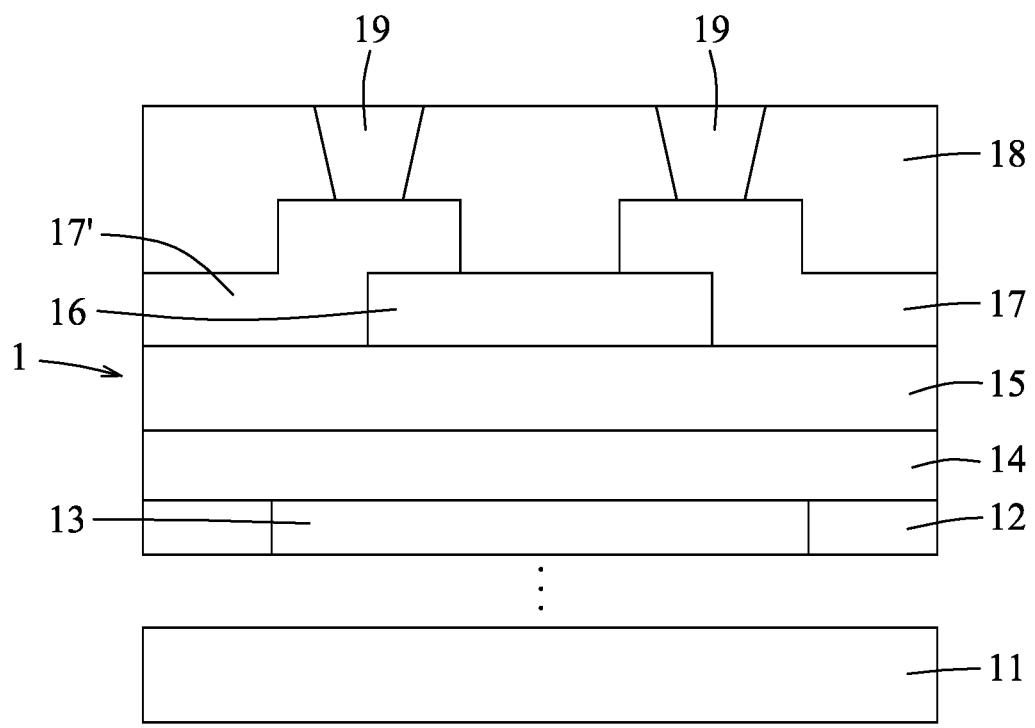
FIG. 8 illustrates a schematic view showing an additional stage for further processing the transistor device as depicted in FIG. 1.

Referring to the example illustrated in FIG. 8, a low-k dielectric material is deposited on the first and second source/drain regions 17, 17' and a portion of the UV-attenuating layer 16 exposed from the opening and is then cured by a UV curing process to form an intermetal dielectric (IMD) layer 18. In some embodiments, the low-k dielectric material may include, for example but not limited to, SiCOH material, SiOC material, or the like (e.g., SiOC having a dielectric constant k of between approximately 2.0 and 3.5). Deposition of the low-k dielectric material may be performed by a suitable technique, such as CVD, PECVD, ALD, PEALD, or the like. The IMD layer 18 may have a thickness ranging from 50 nm to 5000 nm. The IMD layer 18 may be formed of a single layer or multiple layers of the low-k dielectric material.

Source/drain via contacts 19 are formed in the IMD layer 18 by a single damascene process. The source/drain via contacts 19 are formed in the IMD layer 18 to be in direct contact with the first and second source/drain regions 17, 17', respectively. In some embodiments, the source/drain via contacts 19 are formed by the following steps. First, source/drain via openings are formed through the IMD layer 18 to expose portions of the first and second source/drain regions 17, 17' from the source/drain via openings, respectively. That is, the source/drain via openings extend from a top surface of the IMD layer 18 to top surfaces of the first and second source/drain regions 17, 17'. After the source/drain via openings are formed, the source/drain via contacts 19 are formed in the IMD layer 18 by depositing a metallic material to fill the source/drain via openings and removing excess of the metallic material by a planarization technique, such as CMP. In some embodiments, the metallic material may include, for example but not limited to, cobalt, tungsten, copper, titanium, tantalum, aluminum, zirconium, hafnium, or combinations thereof. In some embodiments, deposition of the metallic material may be performed by a suitable technique, such as CVD, ALD, plating, or other suitable deposition techniques.

Figure 9:
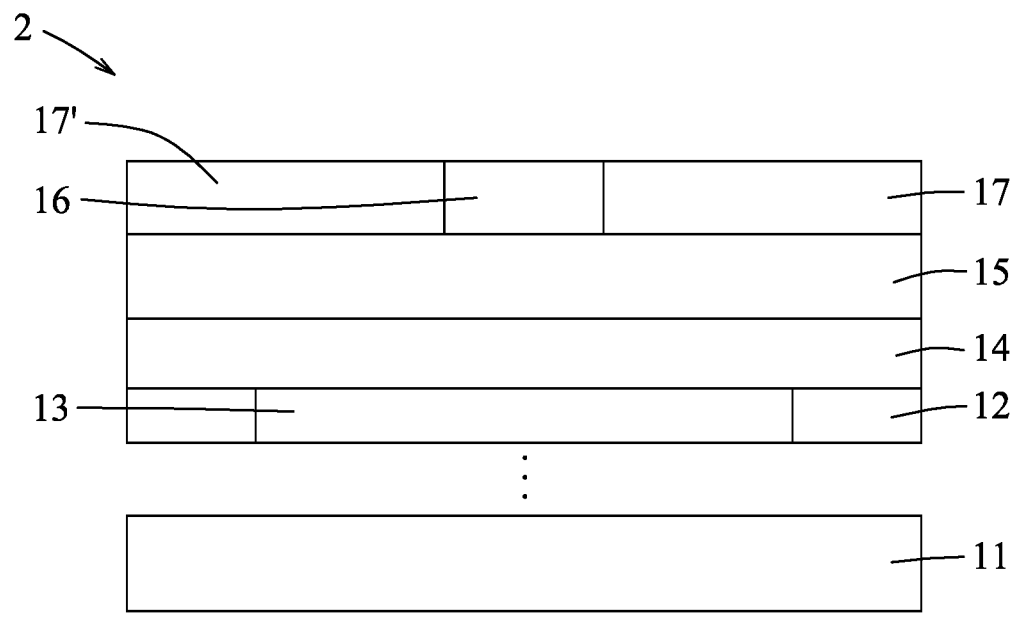
FIG. 9 illustrates a schematic view of a transistor device in accordance with some embodiments.

FIG. 9 illustrates a schematic view of a transistor device in accordance with some embodiments. A transistor device 2 is disposed on a substrate 11 and is a TFT device having a back gate configuration. The transistor device 2 includes a dielectric layer 12, a gate electrode 13, a high-k gate insulator layer 14, a channel layer 15, a UV-attenuating layer 16, a first source/drain region 17, and a second source/drain region 17'. The dielectric layer 12 is formed on the substrate 11. The gate electrode 13 is formed in the dielectric layer 12 and on the substrate 11. The high-k gate insulator layer 14 is formed on the dielectric layer 12 and the gate electrode 13. The channel layer 15 is formed on the high-k gate insulator layer 14. The UV-attenuating layer 16 is formed on the channel layer 15. The first and second source/drain regions 17, 17' are formed on the channel layer 15 and spaced apart from each other by the UV-attenuating layer 16, and have top surfaces coplanar with a top surface of the UV-attenuating layer 16. The channel layer 15 is electrically connected to the first and second source/drain regions 17, 17'.

Figure 10:
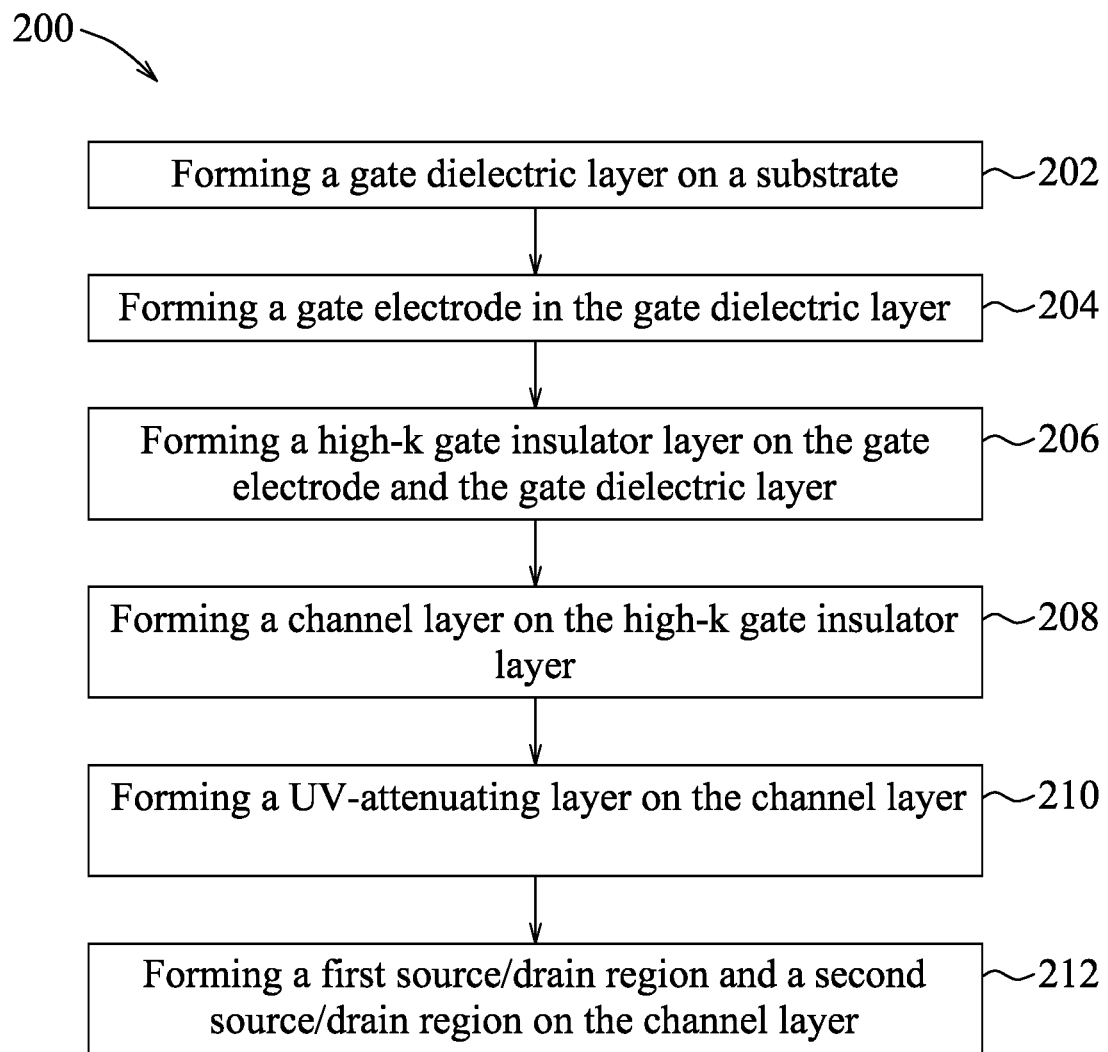
FIG. 10 is a flow diagram illustrating a method for manufacturing the transistor device as depicted in FIG. 9.

FIG. 10 illustrates a method 200 for manufacturing the transistor device 2 in accordance with some embodiments. Additional steps can be provided before, after or during the method 200, and some of the steps described herein may be replaced by other steps or be eliminated. Similarly, further additional features may be present in the transistor device 2, and/or features present may be replaced or eliminated in additional embodiments.

Referring to FIG. 10, the method 200 begins at block 202, where a dielectric layer is formed on a substrate, and then proceeds to blocks 204, 206, 208, and 210, where a gate electrode, a high-k gate insulator layer, a channel layer, and a UV-attenuating layer are formed, respectively. Details regarding the materials and the formation of the dielectric layer 12, the gate electrode 13, the high-k gate insulator layer 14, the channel layer 15, and the UV-attenuating layer 16 (see the example of FIG. 9) are the same as or similar to those described above with respect to the transistor device 1.

The method 200 then proceeds to blocks 212, where a first source/drain region and a second source/drain region are formed on the channel layer. Referring to the example illustrated in FIG. 9, the first and second source/drain regions 17, 17' are formed on the channel layer 15 by depositing a layer of semiconductor material over the channel layer 15 and removing excess of the semiconductor material by a planarization technique, such as CMP. Details regarding the materials and the deposition of the semiconductor material are the same as or similar to those described above with respect to the transistor device 1.

Figure 11:
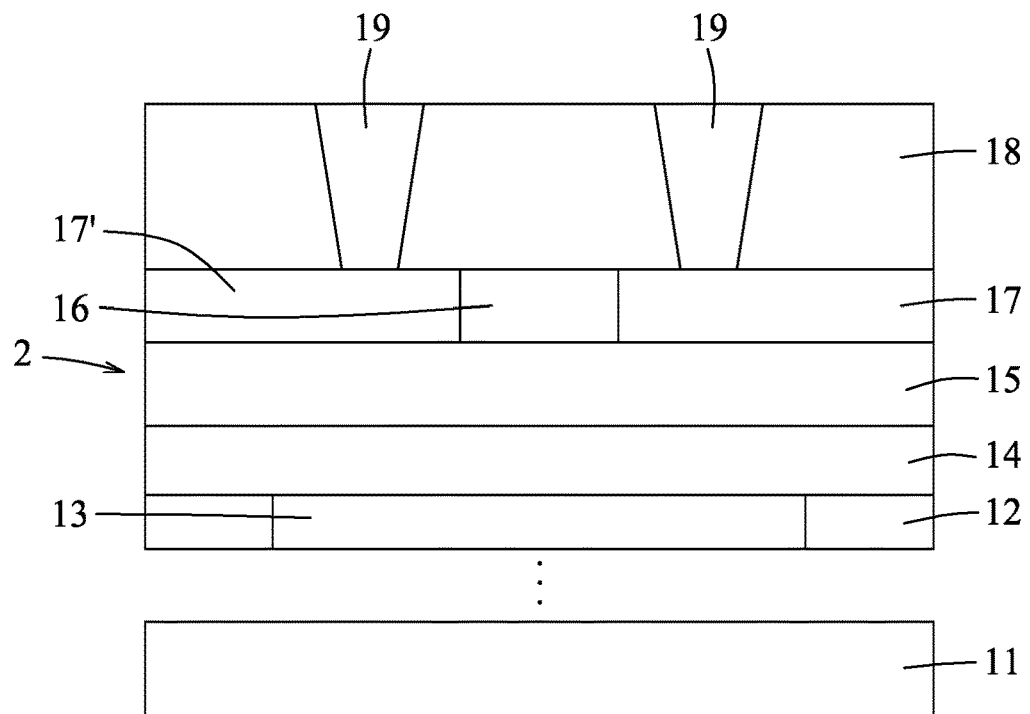
FIG. 11 illustrates a schematic view showing an additional stage for further processing the transistor device as depicted in FIG. 9.

Referring to the example illustrated in FIG. 11, an IMD layer 18 is formed on the UV-attenuating layer 16 and the first and second source/drain regions 17, 17', and source/drain via contacts 19 are formed in the IMD layer 18 to be in contact with the first and second source/drain regions 17, 17', respectively. Details regarding the materials and the formation of the IMD layer 18 and the source/drain via contacts 19 are the same as or similar to those described above with respect to the transistor device 1.

Figure 12:
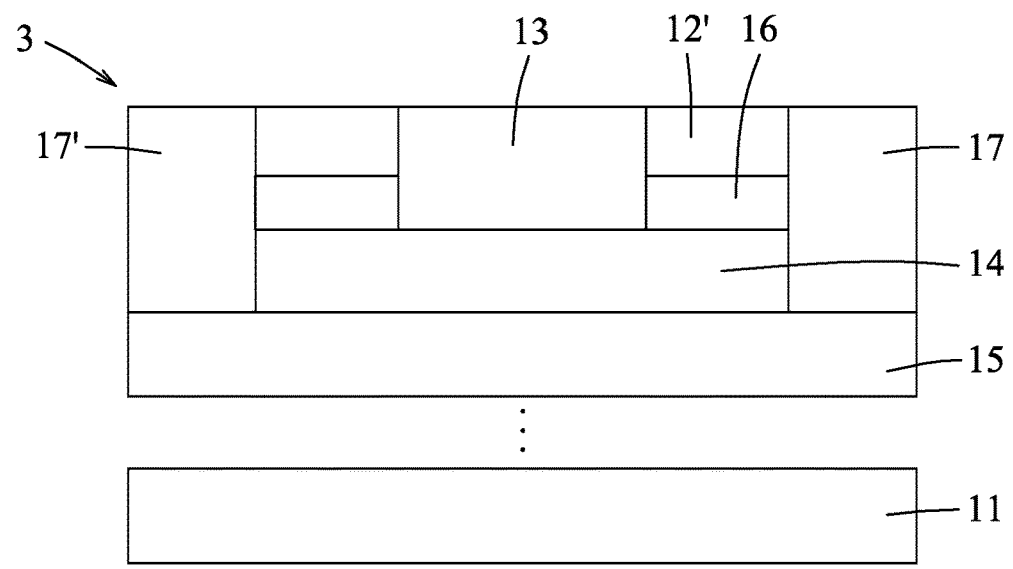
FIG. 12 illustrates a schematic view of a transistor device in accordance with some embodiments.

FIG. 12 illustrates a schematic view of a transistor device in accordance with some embodiments. A transistor device 3 is disposed on a substrate 11 and is a TFT device having a front gate configuration. The transistor device 3 includes a channel layer 15, a high-k gate insulator layer 14, a UV-attenuating layer 16, a dielectric layer 12', a gate electrode 13, a first source/drain region 17, and a second source/drain region 17'. The channel layer 15 is formed on the substrate 11. The high-k gate insulator layer 14 is formed on the channel layer 15. The UV-attenuating layer 16 is formed on the high-k gate insulator layer 14, and is isolated from the channel layer 15 by the high-k gate insulator layer 14. The dielectric layer 12' is formed on the UV-attenuating layer 16. The gate electrode 13 penetrates through the dielectric layer 12' and the UV-attenuating layer 16 so as to be in contact with and disposed on the high-k gate insulator layer 14. The first and second source/drain regions 17, 17' penetrate through the dielectric layer 12', the UV-attenuating layer 16, and the high-k gate insulator layer 14 so as to be in contact with and disposed on the channel layer 15. That is, the channel layer 15 is electrically connected to the first and second source/drain regions 17, 17'.

Figure 13:
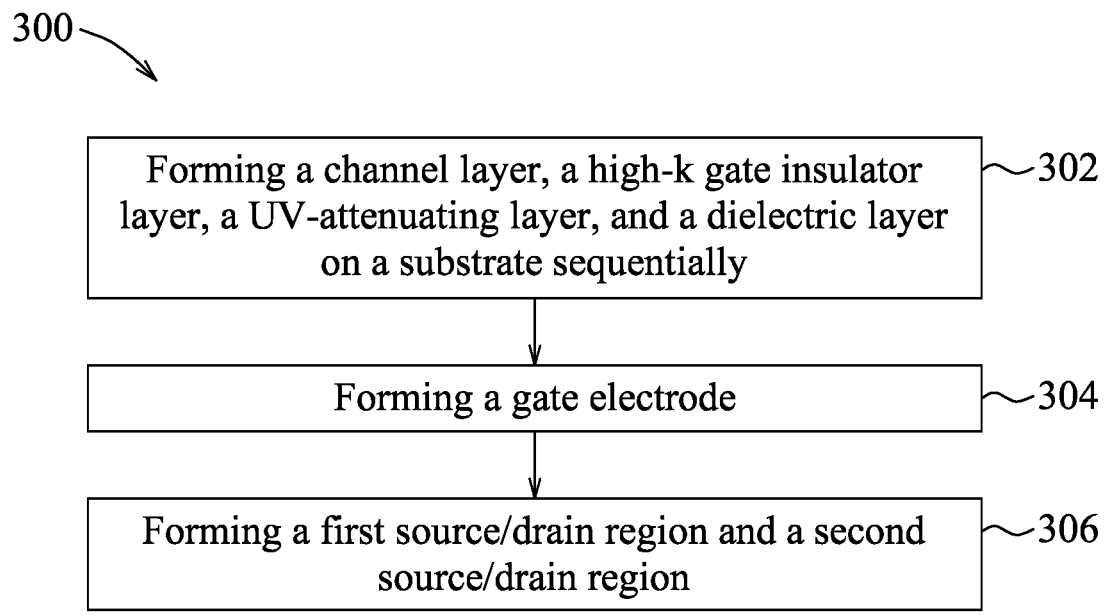
FIG. 13 is a flow diagram illustrating a method for manufacturing the transistor device as depicted in FIG. 12.

FIG. 13 illustrates a method 300 for manufacturing the transistor device 3 in accordance with some embodiments. Additional steps can be provided before, after or during the method 300, and some of the steps described herein may be replaced by other steps or be eliminated. Similarly, further additional features may be present in the transistor device 3, and/or features present may be replaced or eliminated in additional embodiments.

Figure 14:
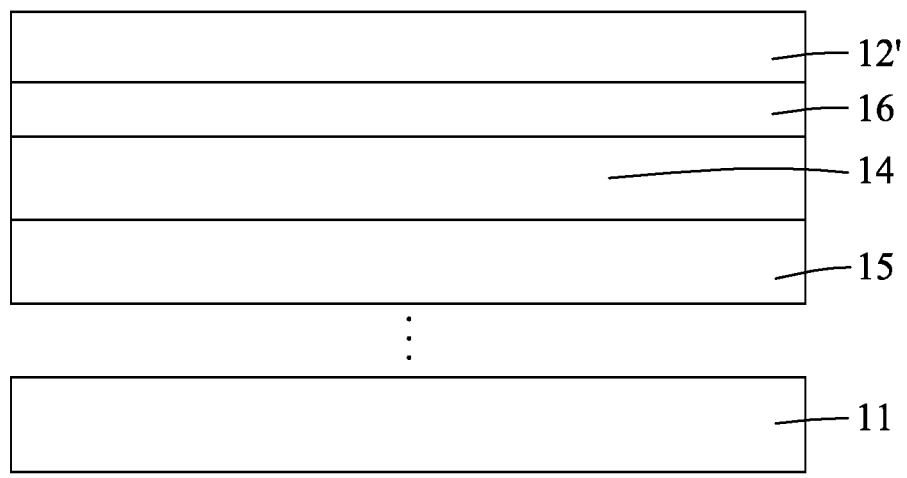
FIGS. 14 and 15 illustrate schematic views showing intermediate stages of the method as depicted in FIG. 13.

Referring to FIG. 13, the method 300 begins at block 302, where a channel layer, a high-k gate insulator layer, a UV-attenuating layer, and a dielectric layer are deposited on a substrate sequentially. Referring to the example illustrated in FIG. 14, the channel layer 15, the high-k gate insulator layer 14, the UV-attenuating layer 16, and the dielectric layer 12' are deposited on the substrate 11 sequentially. Details regarding the materials and the deposition of the channel layer 15, the high-k gate insulator layer 14, and the UV-attenuating layer 16 are the same as or similar to those described above with respect to the transistor device 1, and details regarding the material and the deposition of the dielectric layer 12' are similar to those described above for the dielectric layer 12 of the transistor device 1.

Figure 15:
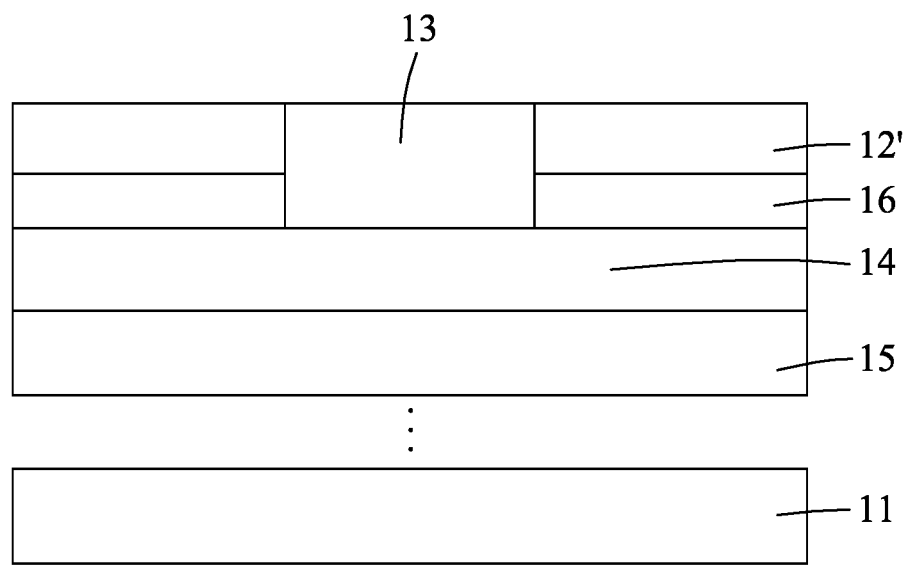

Referring to FIG. 13, the method 300 then proceeds to block 304, where a gate electrode is formed. Referring to the example illustrated in FIG. 15, the gate electrode 13 is formed to penetrate through the dielectric layer 12' and the UV-attenuating layer 16 so as to be in contact with and disposed on the high-k gate insulator layer 14 by patterning the dielectric layer 12' and the UV-attenuating layer 16 with an etching technique (for example, dry etching, wet etching, or a combination thereof) through a pattern opening of a patterned mask layer (not shown) to form an opening to expose the high-k gate insulator layer 14, depositing a conductive material in the opening, and removing excess of the conductive material by a planarization technique, such as CMP. Depositing may be performed by a suitable technique, such as CVD, PECVD, ALD, or other suitable processes. The conductive material of the gate electrode 13 of the transistor device 3 is the same as or similar to that described above for the gate electrode 13 of the transistor device 1.

Referring to FIG. 13, the method 300 then proceeds to block 306, where a first source/drain region and a second source/drain region are formed. Referring to the example illustrated in FIG. 12, the first and second source/drain regions 17, 17' are formed to penetrate through the dielectric layer 12', the UV-attenuating layer 16, and the high-k gate insulator layer 14 so as to be in contact with and disposed on the channel layer 15 by patterning the dielectric layer 12', the UV-attenuating layer 16 and the high-k gate insulator layer 14 with an etching technique (for example, dry etching, wet etching, or a combination thereof) through a pattern opening of a patterned mask layer (not shown) to form an opening to expose the channel layer 15, depositing a conductive material, and removing excess of the conductive material by a planarization technique, such as CMP. Depositing may be performed by a suitable technique, such as CVD, PECVD, ALD, or other suitable processes. The conductive material of the first and second source/drain regions 17, 17' of the transistor device 3 is the same as or similar to that described above for the first/second source/drain regions 17, 17' of the transistor device 1.

Figure 16:
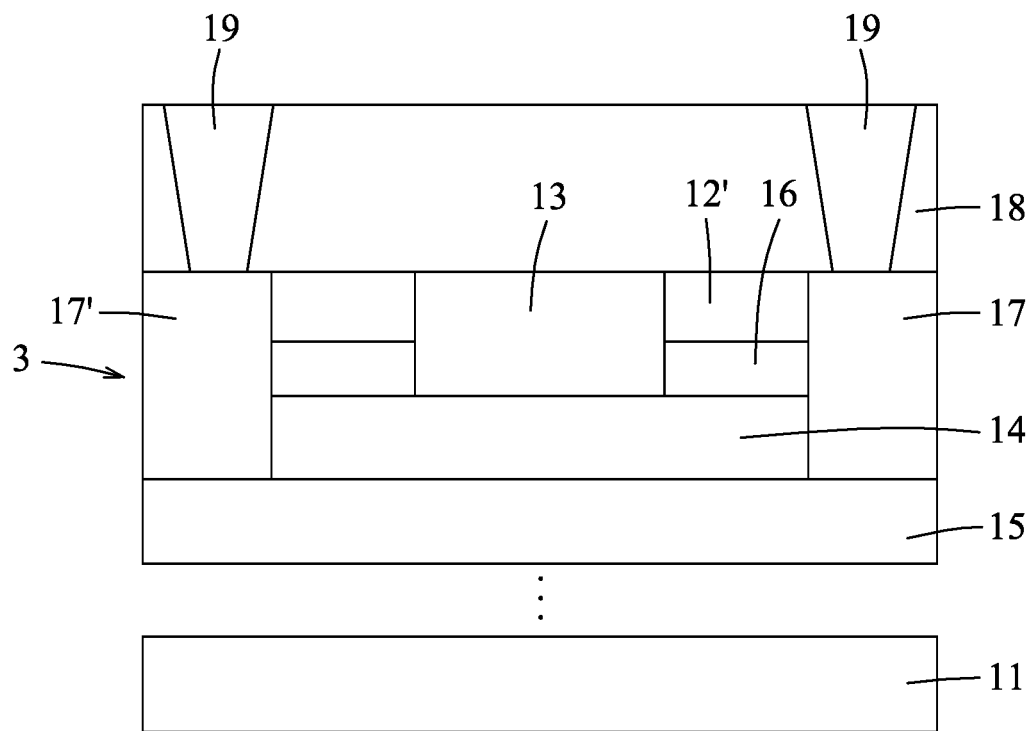
FIG. 16 illustrates a schematic view showing an additional stage for further processing the transistor device as depicted in FIG. 12.

Referring to the example illustrated in FIG. 16, an IMD layer 18 is formed on the first and second source/drain regions 17, 17', the gate electrode 13, and the dielectric layer 12', and source/drain via contacts 19 are formed in the IMD layer 18 to be in contact with the first and second source/drain regions 17, 17', respectively. Details regarding the materials and the formation of the IMD layer 18 and the source/drain via contacts 19 are the same as or similar to those described above with respect to the transistor device 1.

In the transistor devices 1, 2, 3, the UV-attenuating layer 16 is made of the UV-attenuating material. Therefore, when the low-k dielectric material deposited over the UV-attenuating layer 16 is cured by the UV curing process to form the IMD layer 18, the UV-attenuating layer 16 may act as a shielding layer to protect the channel layer 15 disposed below the UV-attenuating layer 16 from characteristic degradation which may be caused by the UV light used in the UV curing process.

Figure 17:
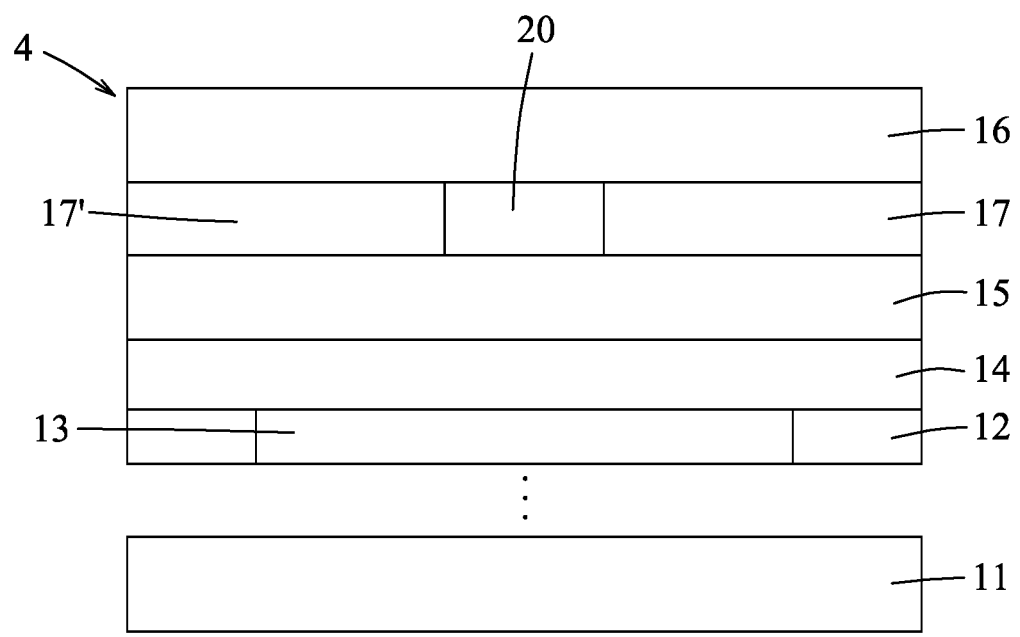
FIG. 17 illustrates a schematic view of a transistor device in accordance with some embodiments.

FIG. 17 illustrates a schematic view of a transistor device in accordance with some embodiments. A transistor device 4 is disposed on a substrate 11 and is a TFT device having a back gate configuration. The transistor device 4 includes a dielectric layer 12, a gate electrode 13, a high-k gate insulator layer 14, a channel layer 15, a capping layer 20, a first source/drain region 17, a second source/drain region 17', and a UV-attenuating layer 16. The dielectric layer 12 is formed on the substrate 11. The gate electrode 13 is formed in the dielectric layer 12 and on the substrate 11. The high-k gate insulator layer 14 is formed on the dielectric layer 12 and the gate electrode 13. The channel layer 15 is formed on the high-k gate insulator layer 14. The capping layer 20 is formed on the channel layer 15. The first and second source/drain regions 17, 17' are formed on the channel layer 15 and spaced apart from each other by the capping layer 20, and have top surfaces coplanar with a top surface of the capping layer 20. The UV-attenuating layer 16 is formed on the capping layer 20 and the first and second source/drain regions 17, 17'. The channel layer 15 is electrically connected to the first and second source/drain regions 17, 17'.

Figure 18:
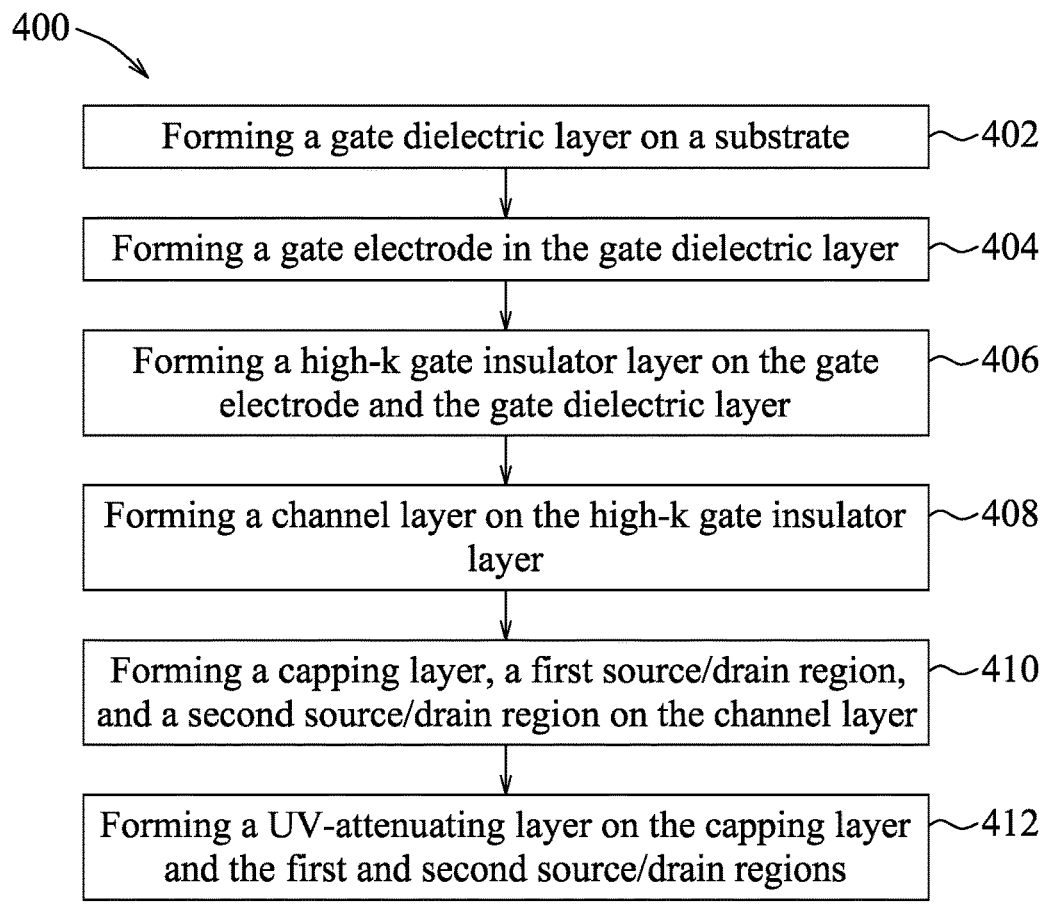
FIG. 18 is a flow diagram illustrating a method for manufacturing the transistor device as depicted in FIG. 17.

FIG. 18 illustrates a method 400 for manufacturing the transistor device 4 in accordance with some embodiments. Additional steps can be provided before, after or during the method 400, and some of the steps described herein may be replaced by other steps or be eliminated. Similarly, further additional features may be present in the transistor device 4, and/or features present may be replaced or eliminated in additional embodiments.

Referring to FIG. 18, the method 400 begins at block 402, where a dielectric layer is formed on a substrate, and then proceeds to blocks 404, 406, and 408, where a gate electrode, a high-k gate insulator layer, and a channel layer are formed, respectively. Details regarding the materials and the formation of the dielectric layer 12, the gate electrode 13, the high-k gate insulator layer 14, and the channel layer 15 are the same as or similar to those described above with respect to the transistor device 1.

Figure 19:
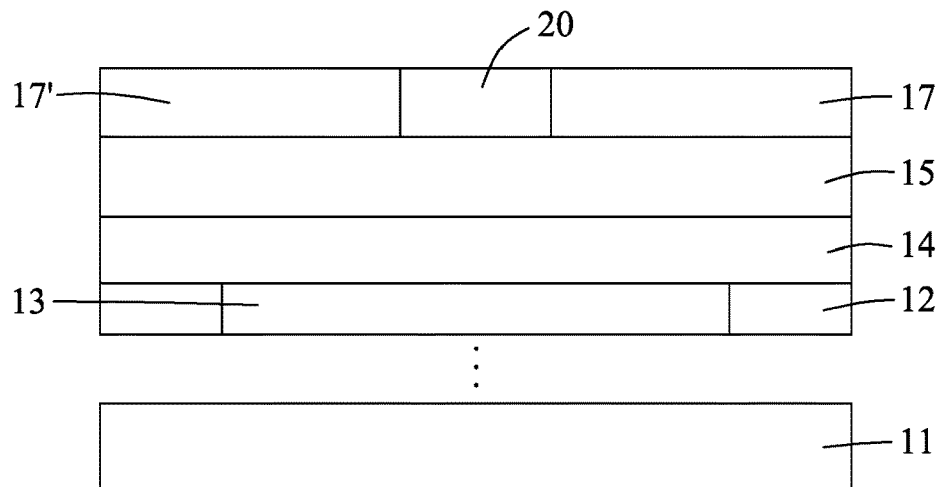
FIG. 19 illustrates a schematic view showing an intermediate stage of the method as depicted in FIG. 17.

The method 400 then proceeds to blocks 410, where a capping layer, a first source/drain region, and a second source/drain region are formed on the channel layer. Referring to the example illustrated in FIG. 19, the capping layer 20 and the first and second source/drain regions 17, 17' are formed on the channel layer 15. Specifically, the capping layer 20 is formed on the channel layer 15 by suitable depositing and patterning techniques. In some embodiments, a material of the capping layer 20 may include, for example but not limited to, Al2O3, ZrNi, SiO2, or the like. In some embodiments, depositing may be performed by a suitable technique, such as ALD, CVD, PVD, or the like. In some embodiments, patterning may be performed by an etching technique (for example, dry etching, wet etching, or a combination thereof) through a pattern opening of a patterned mask layer (not shown). The first and second source/drain regions 17, 17' are then formed on the channel layer 15 by depositing a layer of semiconductor material over the channel layer 15 and removing excess of the semiconductor material by a planarization technique, such as CMP. Details regarding the material and the deposition of the semiconductor material are the same as or similar to those described above with respect to the transistor device 1.

The method 400 then proceeds to blocks 412, where a UV-attenuating layer is formed on the capping layer and the first and second source/drain regions. Referring to the example illustrated in FIG. 17, the UV-attenuating layer 16 is formed on the capping layer 20 and the first and second source/drain regions 17, 17' by a suitable deposition technique. Details regarding the material and the formation of the UV-attenuating layer 16 are the same as or similar to those described above with respect to the transistor device 1.

Figure 20:
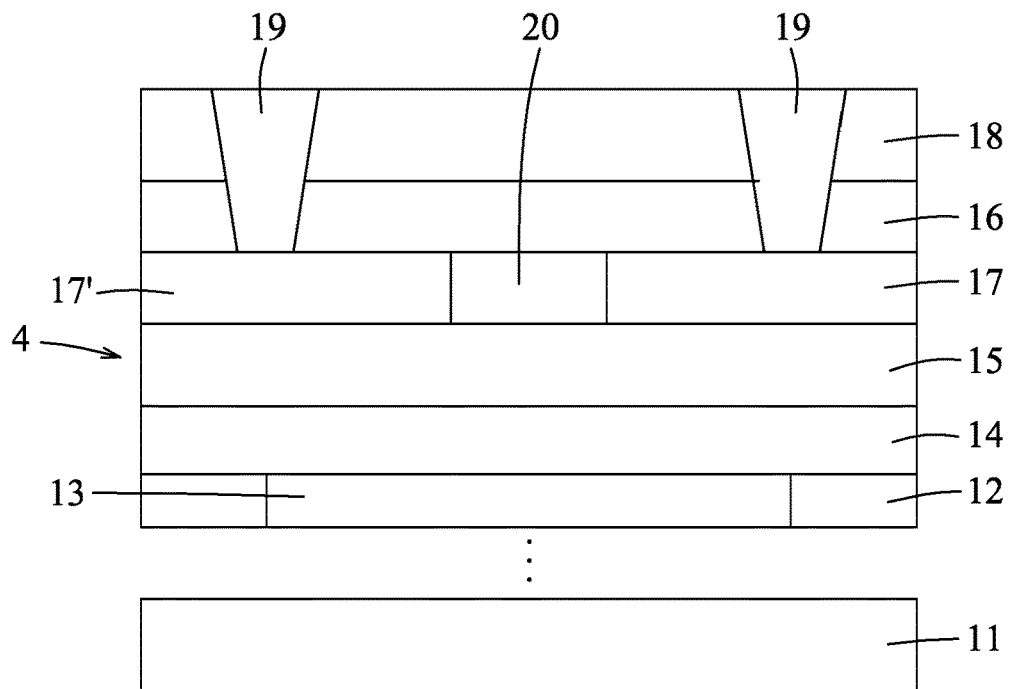
FIG. 20 illustrates a schematic view showing an additional stage for further processing the transistor device as depicted in FIG. 17.

Referring to the example illustrated in FIG. 20, an IMD layer 18 is formed on the UV-attenuating layer 16, and source/drain via contacts 19 are formed to penetrate through the IMD layer 18 and the UV-attenuating layer 16 so as to be in contact with the first and second source/drain regions 17, 17', respectively. Details regarding the materials and the formation of the IMD layer 18 and the source/drain via contacts 19 are the same as or similar to those described above with respect to the transistor device 1.

Figure 21:
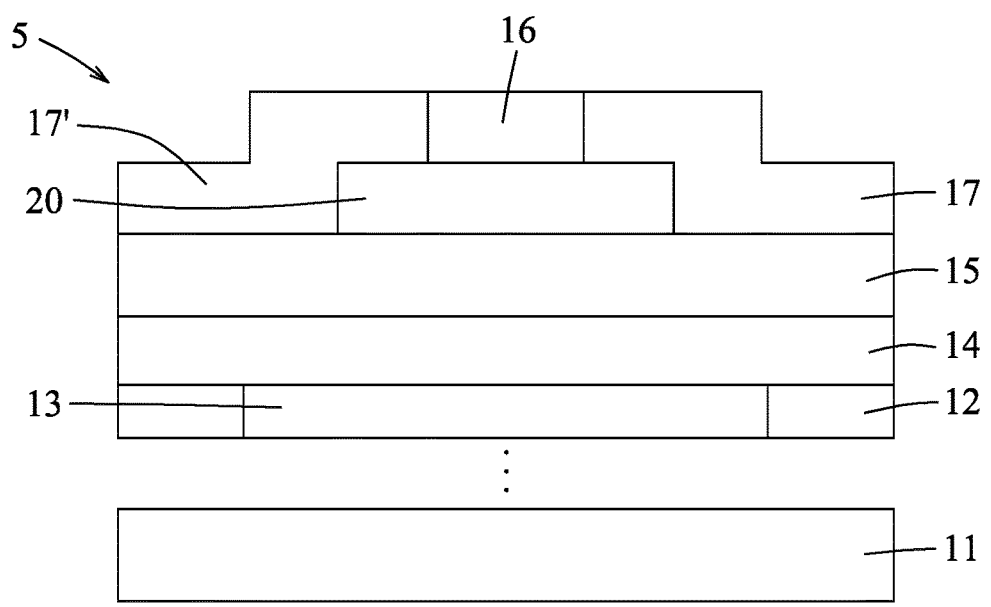
FIG. 21 illustrates a schematic view of a transistor device in accordance with some embodiments.

FIG. 21 illustrates a schematic view of a transistor device in accordance with some embodiments. A transistor device 5 is disposed on a substrate 11 and is a TFT device having a back gate configuration. The transistor device 5 includes a dielectric layer 12, a gate electrode 13, a high-k gate insulator layer 14, a channel layer 15, a capping layer 20, a UV-attenuating layer 16, a first source/drain region 17, and a second source/drain region 17'. The dielectric layer 12 is formed on the substrate 11. The gate electrode 13 is formed in the dielectric layer 12 and on the substrate 11. The high-k gate insulator layer 14 is formed on the dielectric layer 12 and the gate electrode 13. The channel layer 15 is formed on the high-k gate insulator layer 14. The capping layer 20 is formed on the channel layer 15. The UV-attenuating layer 16 is formed on the capping layer 20. The first and second source/drain regions 17, 17' are formed on the channel layer 15 and the capping layer 20, and are spaced apart from each other by the UV-attenuating layer 16 and the capping layer 20. The channel layer 15 is electrically connected to the first and second source/drain regions 17, 17'.

Figure 22:
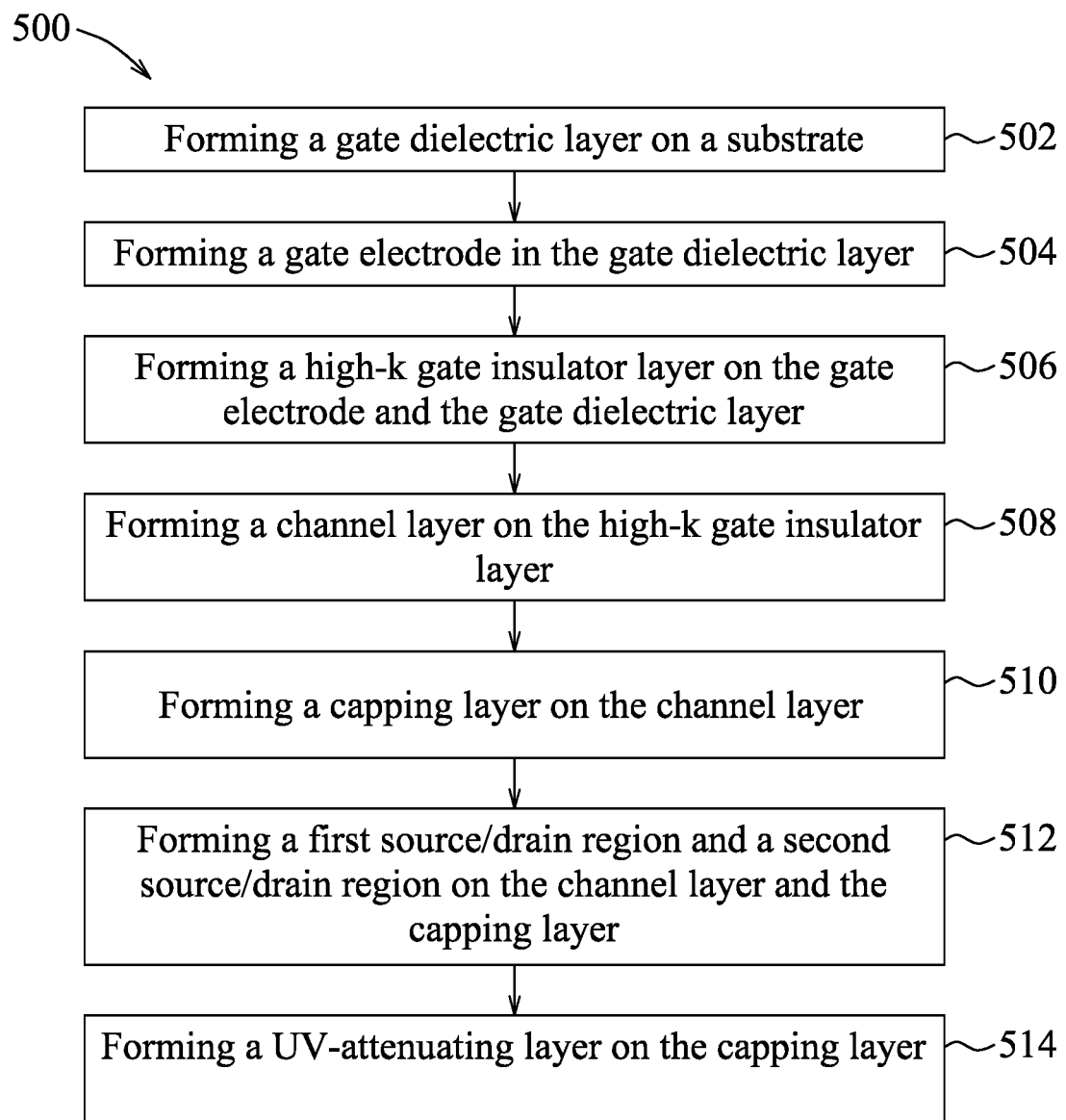
FIG. 22 is a flow diagram illustrating a method for manufacturing the transistor device as depicted in FIG. 21.

FIG. 22 illustrates a method 500 for manufacturing the transistor device 5 in accordance with some embodiments. Additional steps can be provided before, after or during the method 500, and some of the steps described herein may be replaced by other steps or be eliminated. Similarly, further additional features may be present in the transistor device 5, and/or features present may be replaced or eliminated in additional embodiments.

Referring to FIG. 22, the method 500 begins at block 502, where a dielectric layer is formed on a substrate, and then proceeds to blocks 504, 506, 508, 510, 512, and 514, where a gate electrode, a high-k gate insulator layer, a channel layer, a capping layer, first and second source/drain regions, and a UV-attenuating layer are formed, respectively. The method 500 is similar to the method 100 except the following.

Figure 23:
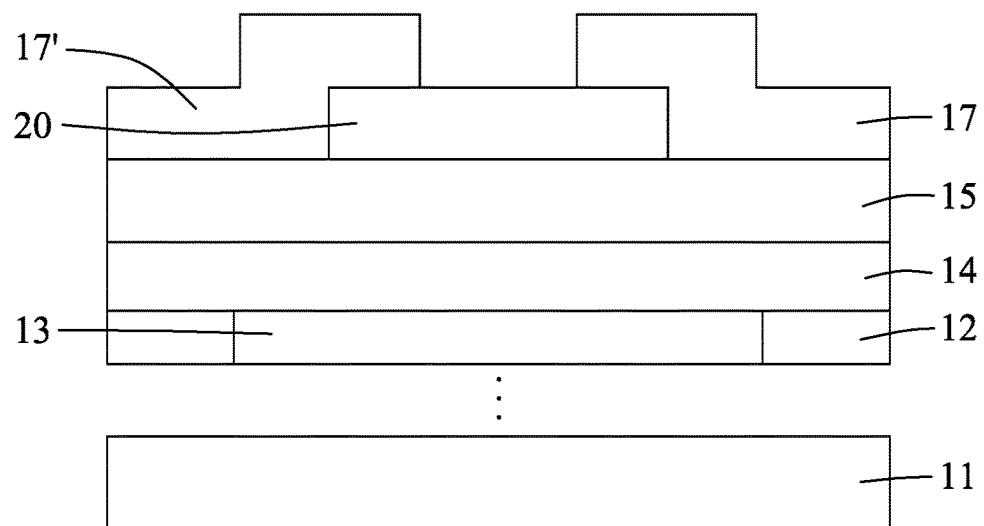
FIG. 23 illustrates a schematic view showing an intermediate stage of the method as depicted in FIG. 22.

Referring to the example illustrated in FIG. 23, instead of forming the UV-attenuating layer 16 on the channel layer 15, the capping layer 20 is formed on the channel layer 15. The first and second source/drain regions 17, 17' are then formed on the channel layer 15 and the capping layer 20 to be separate from each other.

Referring to the example illustrated in FIG. 21, the UV-attenuating layer 16 is then formed on the capping layer 20 and between the first and second source/drain regions 17, 17'.

Details regarding the materials and the formation of the dielectric layer 12, the gate electrode 13, the high-k gate insulator layer 14, the channel layer 15, the capping layer 20, the first and second source/drain regions 17, 17', and the UV-attenuating layer 16 are the same as or similar to those described above with respect to the transistor device 1 and the transistor device 4.

Figure 24:
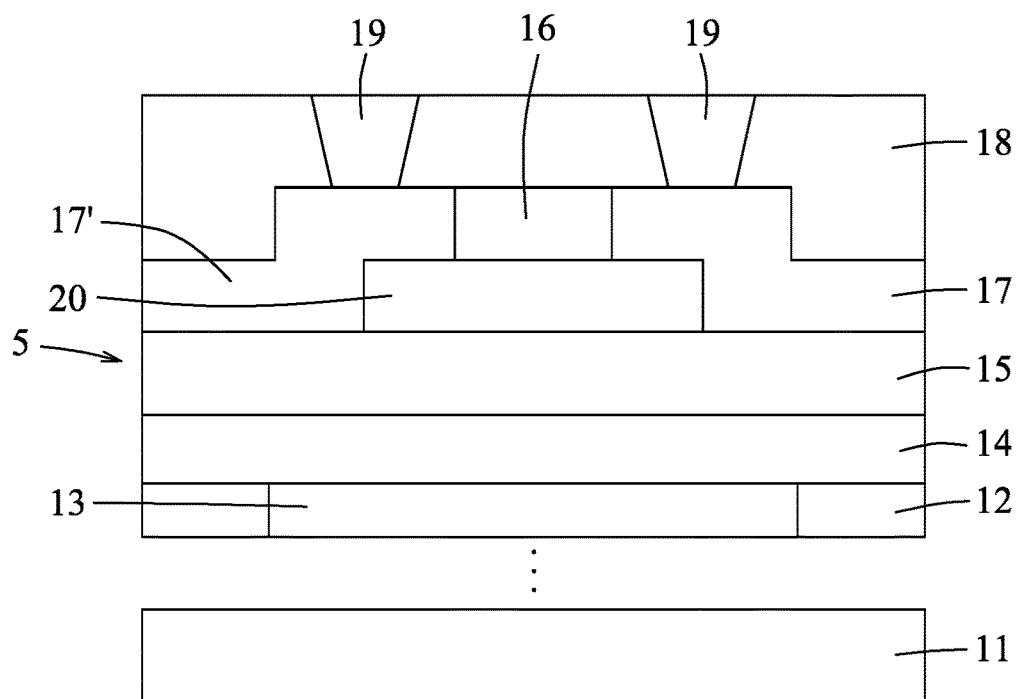
FIG. 24 illustrates a schematic view showing an additional stage for further processing the transistor device as depicted in FIG. 21.

Referring to the example illustrated in FIG. 24, an IMD layer 18 is formed on the UV-attenuating layer 16 and the first and second source/drain regions 17, 17', and source/drain via contacts 19 are formed in the IMD layer 18 so as to be in contact with the first and second source/drain regions 17, 17', respectively. Details regarding the materials and the formation of the IMD layer 18 and the source/drain via contacts 19 are the same as or similar to those described above with respect to the transistor device 1.

Figure 25:
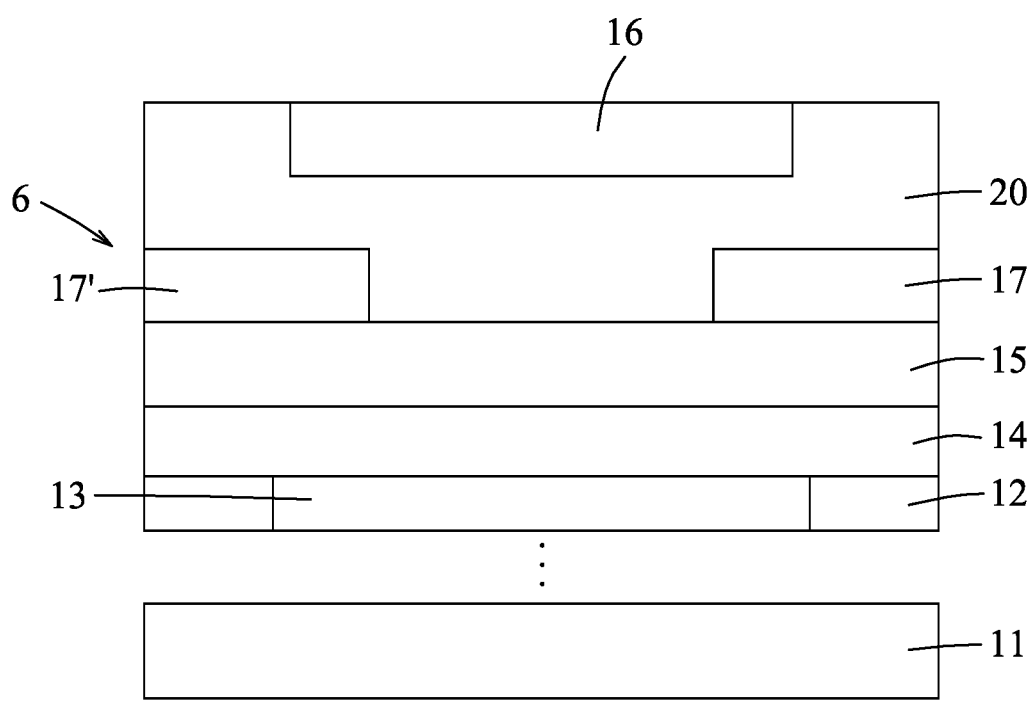
FIG. 25 illustrates a schematic view of a transistor device in accordance with some embodiments.

FIG. 25 illustrates a schematic view of a transistor device in accordance with some embodiments. A transistor device 6 is disposed on a substrate 11 and is a TFT device having a back gate configuration. The transistor device 6 includes a dielectric layer 12, a gate electrode 13, a high-k gate insulator layer 14, a channel layer 15, a capping layer 20, a first source/drain region 17, a second source/drain region 17', and a UV-attenuating layer 16. The dielectric layer 12 is formed on the substrate 11. The gate electrode 13 is formed in the dielectric layer 12 and on the substrate 11. The high-k gate insulator layer 14 is formed on the dielectric layer 12 and the gate electrode 13. The channel layer 15 is formed on the high-k gate insulator layer 14. The first and second source/drain regions 17, 17' are formed on the channel layer 15 and spaced apart from each other. The capping layer 20 is formed on the channel layer 15 and covers the first and second source/drain regions 17, 17'. The UV-attenuating layer 16 is inserted in the capping layer 20 and spaced apart from the first and second source/drain regions 17, 17' and the channel layer 15 by the capping layer 20. The channel layer 15 is electrically connected to the first and second source/drain regions 17, 17'.

Figure 26:
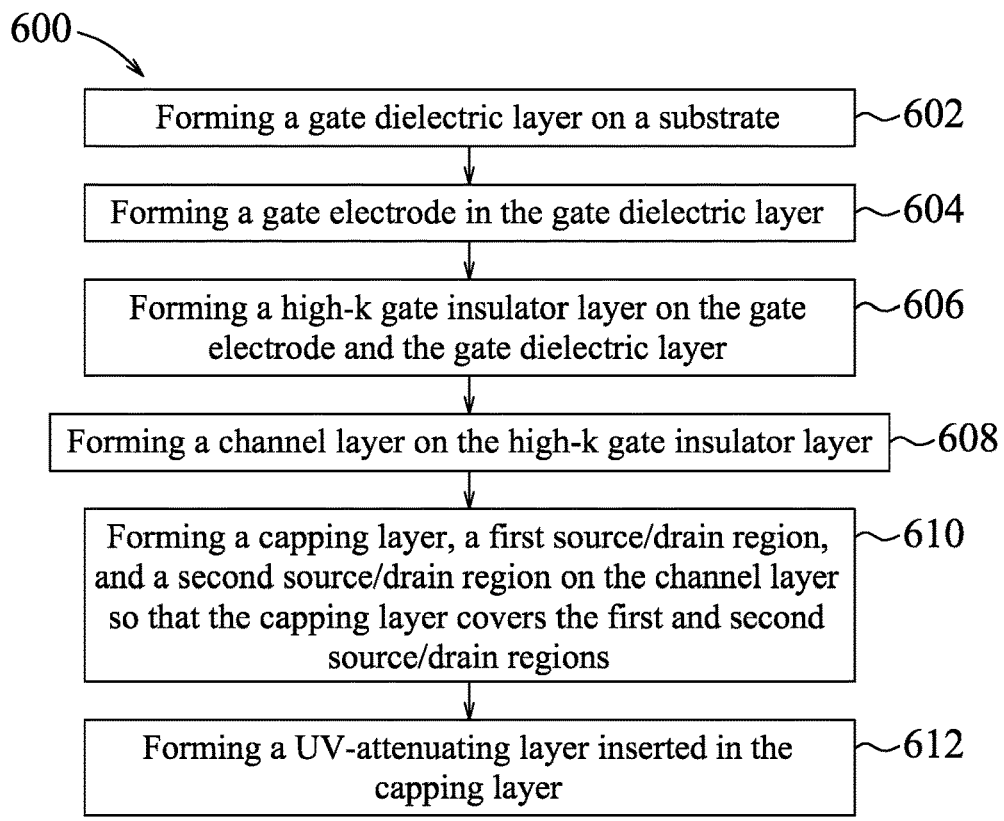
FIG. 26 is a flow diagram illustrating a method for manufacturing the transistor device as depicted in FIG. 25.

FIG. 26 illustrates a method 600 for manufacturing the transistor device 6 in accordance with some embodiments. Additional steps can be provided before, after or during the method 600, and some of the steps described herein may be replaced by other steps or be eliminated. Similarly, further additional features may be present in the transistor device 6, and/or features present may be replaced or eliminated in additional embodiments.

Referring to FIG. 26, the method 600 begins at block 602, where a dielectric layer is formed on a substrate, and then proceeds to blocks 604, 606, 608, 610, and 612, where a gate electrode, a high-k gate insulator layer, a channel layer, a capping layer and first and second source/drain regions, and a UV-attenuating layer are formed, respectively. The method 600 is similar to the method 400 except the following.

Figure 27:
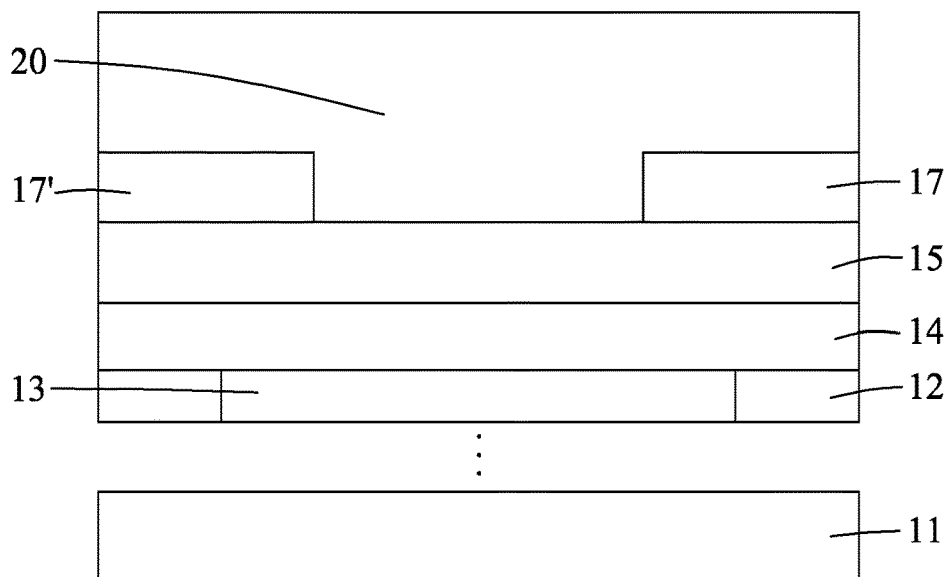
FIG. 27 illustrates a schematic view showing an intermediate stage of the method as depicted in FIG. 26.

Referring to the example illustrated in FIG. 27, after the formation of the first and second source/drain regions 17, 17', the capping layer 20 is further deposited so as to cover the first and second source/drain regions 17, 17'. The capping layer 20 is then recessed by a suitable etching technique, such as wet etching, dry etching, or a combination thereof to form a recess in the capping layer 20. The UV-attenuating layer 16 is then formed in the recess (see FIG. 25).

Figure 28:
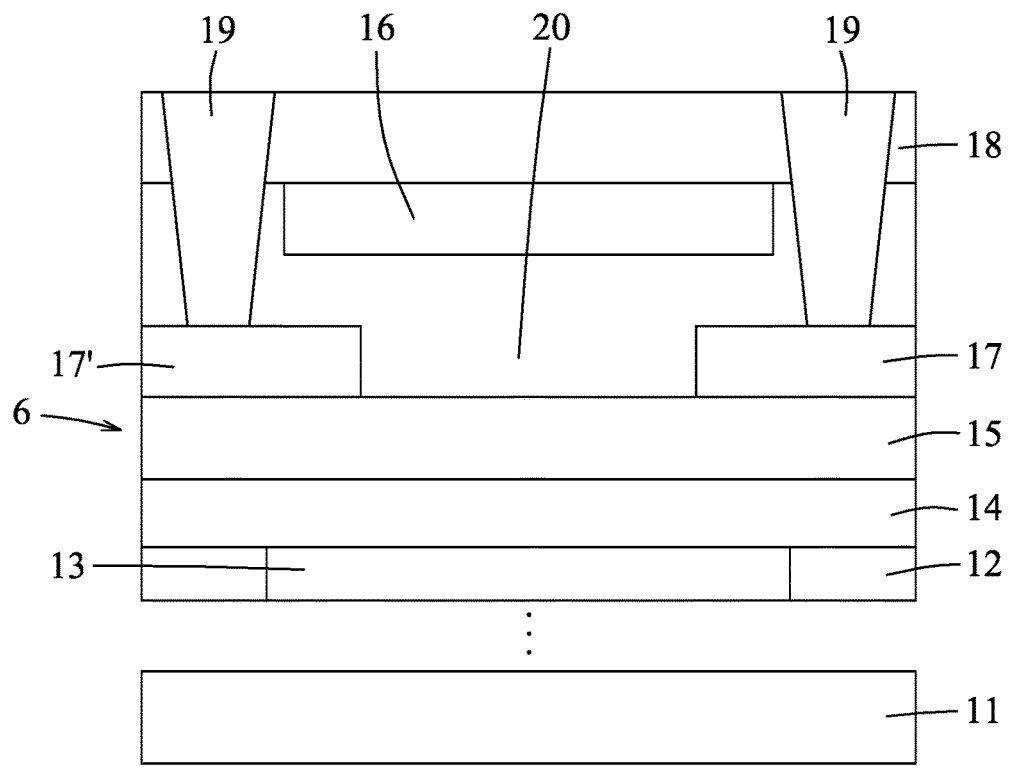
FIG. 28 illustrates a schematic view showing an additional stage for further processing the transistor device as depicted in FIG. 25.

Referring to the example illustrated in FIG. 28, an IMD layer 18 is formed on the UV-attenuating layer 16 and the capping layer 20, and source/drain via contacts 19 are formed to penetrate through the IMD layer 18 and the capping layer 20 so as to be in contact with the first and second source/drain regions 17, 17', respectively. Details regarding the materials and the formation of the IMD layer 18 and the source/drain via contacts 19 are the same as or similar to those described above with respect to the transistor device 1.

Figure 29:
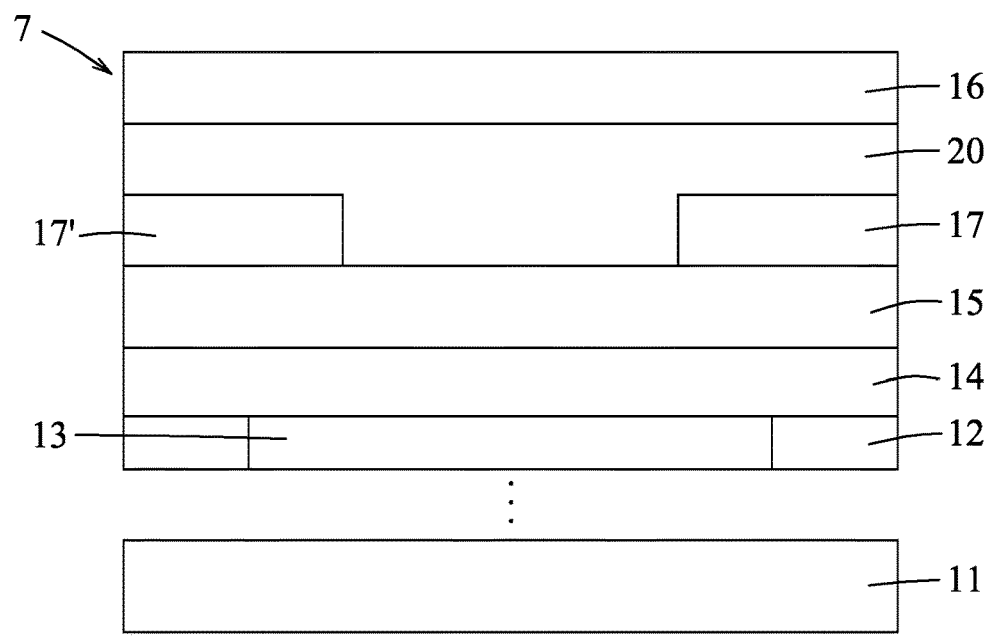
FIG. 29 illustrates a schematic view of a transistor device in accordance with some embodiments.

FIG. 29 illustrates a schematic view of a transistor device in accordance with some embodiments. A transistor device 7 is disposed on a substrate 11 and is a TFT device having a back gate configuration. The transistor device 7 includes a dielectric layer 12, a gate electrode 13, a high-k gate insulator layer 14, a channel layer 15, a capping layer 20, a first source/drain region 17, a second source/drain region 17', and a UV-attenuating layer 16. The dielectric layer 12 is formed on the substrate 11. The gate electrode 13 is formed in the dielectric layer 12 and on the substrate 11. The high-k gate insulator layer 14 is formed on the dielectric layer 12 and the gate electrode 13. The channel layer 15 is formed on the high-k gate insulator layer 14. The first and second source/drain regions 17, 17' are formed on the channel layer 15 and spaced apart from each other. The capping layer 20 is formed on the channel layer 15 and covers the first and second source/drain regions 17, 17'. The UV-attenuating layer 16 is formed on the capping layer 20. The channel layer 15 is electrically connected to the first and second source/drain regions 17, 17'.

Figure 30:
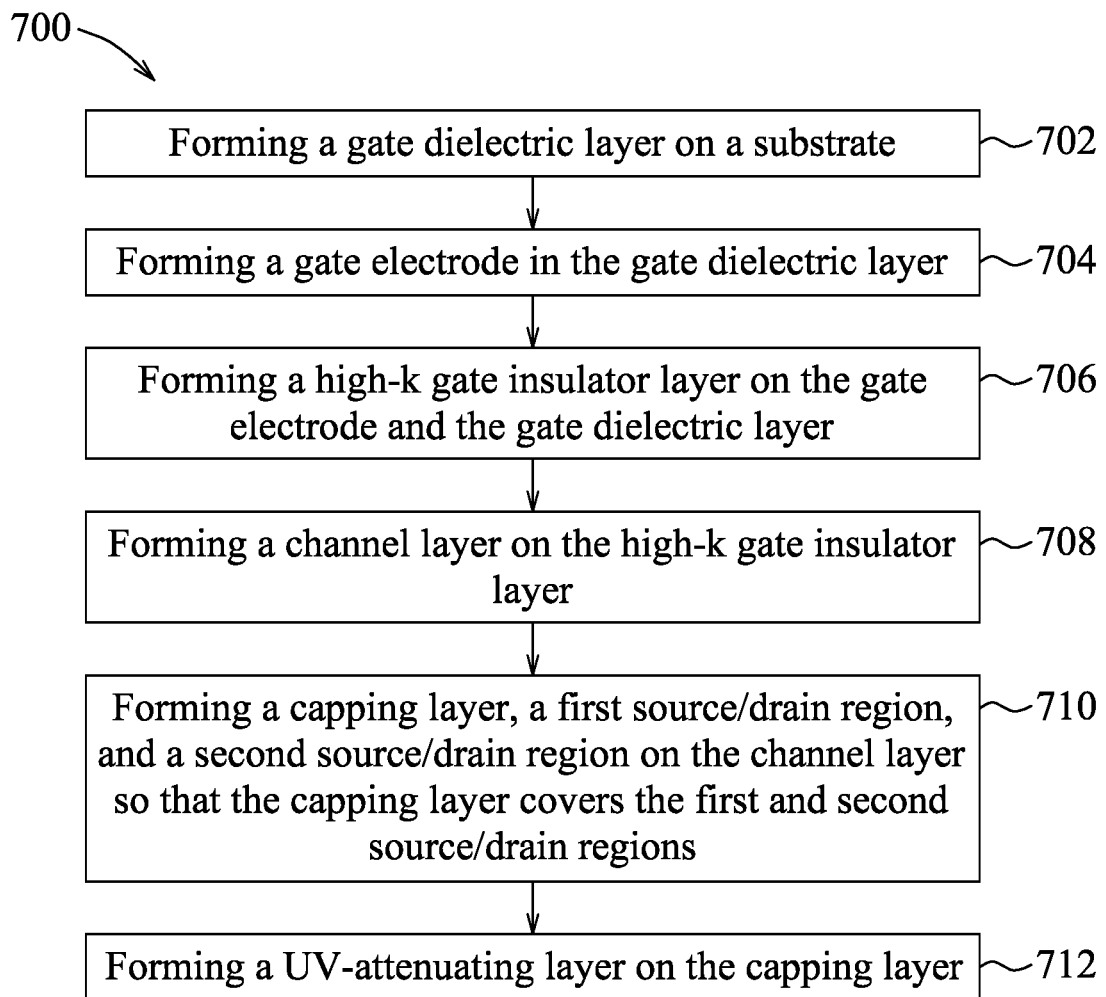
FIG. 30 is a flow diagram illustrating a method for manufacturing the transistor device as depicted in FIG. 29.

FIG. 30 illustrates a method 700 for manufacturing the transistor device 7 in accordance with some embodiments. Additional steps can be provided before, after or during the method 700, and some of the steps described herein may be replaced by other steps or be eliminated. Similarly, further additional features may be present in the transistor device 7, and/or features present may be replaced or eliminated in additional embodiments.

Referring to FIG. 30, the method 700 begins at block 702, where a dielectric layer is formed on a substrate, and then proceeds to blocks 704, 706, 708, 710, and 712, where a gate electrode, a high-k gate insulator layer, a channel layer, a capping layer and first and second source/drain regions, and a UV-attenuating layer are formed, respectively. The method 700 is similar to the method 600 except the following.

Referring to the example illustrated in FIG. 29, after the formation of the capping layer 20, the capping layer 20 is not recessed and the UV-attenuating layer 16 is deposited directly on the capping layer 20.

Figure 31:
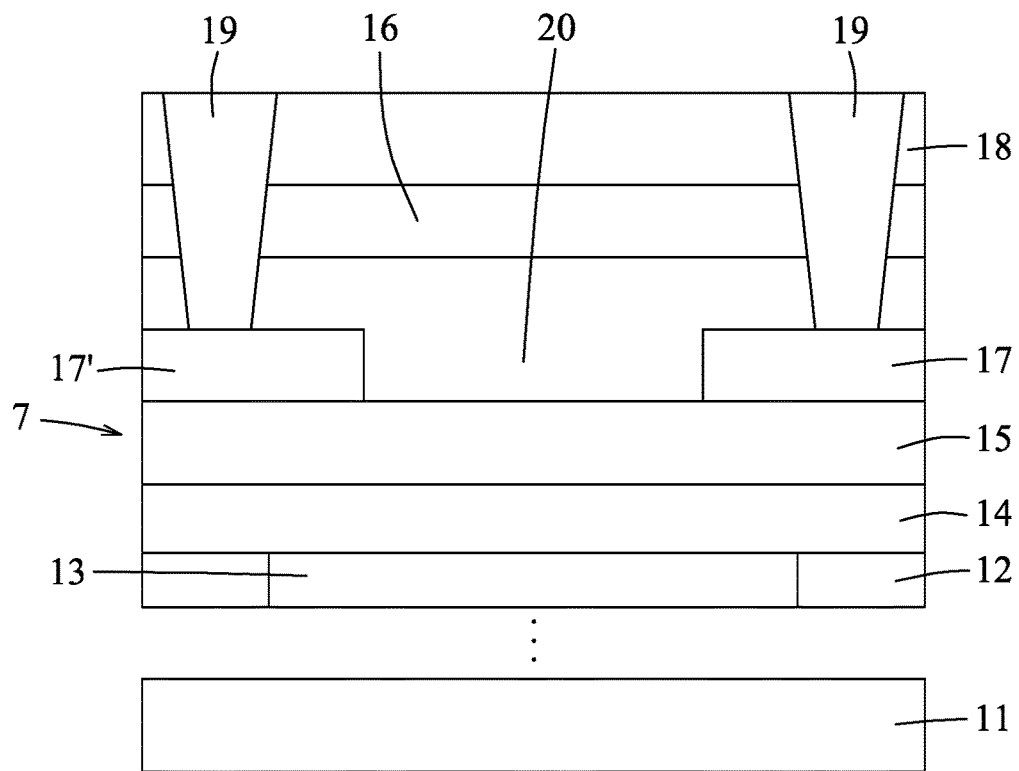
FIG. 31 illustrates a schematic view showing an additional stage for further processing the transistor device as depicted in FIG. 29.

Referring to the example illustrated in FIG. 31, an IMD layer 18 is formed on the UV-attenuating layer 16, and source/drain via contacts 19 are formed to penetrate through the IMD layer 18, the UV-attenuating layer 16, and the capping layer 20 so as to be in contact with the first and second source/drain regions 17, 17', respectively. Details regarding the materials and the formation of the IMD layer 18 and the source/drain via contacts 19 are the same as or similar to those described above with respect to the transistor device 1.

Figure 32:
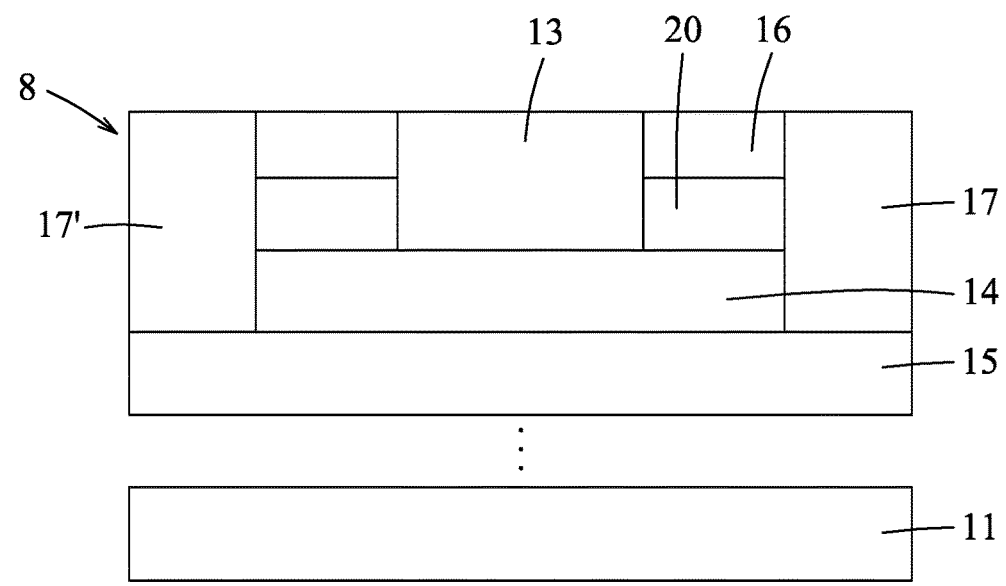
FIG. 32 illustrates a schematic view of a transistor device in accordance with some embodiments.

FIG. 32 illustrates a schematic view of a transistor device in accordance with some embodiments. A transistor device 8 is disposed on a substrate 11 and is a TFT device having a front gate configuration. The transistor device 8 includes a channel layer 15, a high-k gate insulator layer 14, a capping layer 20, a UV-attenuating layer 16, a gate electrode 13, a first source/drain region 17, and a second source/drain region 17'. The channel layer 15 is formed on the substrate 11. The high-k gate insulator layer 14 is formed on the channel layer 15. The capping layer 20 is formed on the high-k gate insulator layer 14. The UV-attenuating layer 16 is formed on the capping layer 20. The gate electrode 13 penetrates through the UV-attenuating layer 16 and the capping layer 20 so as to be in contact with and disposed on the high-k gate insulator layer 14. The first and second source/drain regions 17, 17' penetrate through the UV-attenuating layer 16, the capping layer 20, and the high-k gate insulator layer 14 so as to be in contact with and disposed on the channel layer 15. The channel layer 15 is electrically connected to the first and second source/drain regions 17, 17'.

Figure 33:
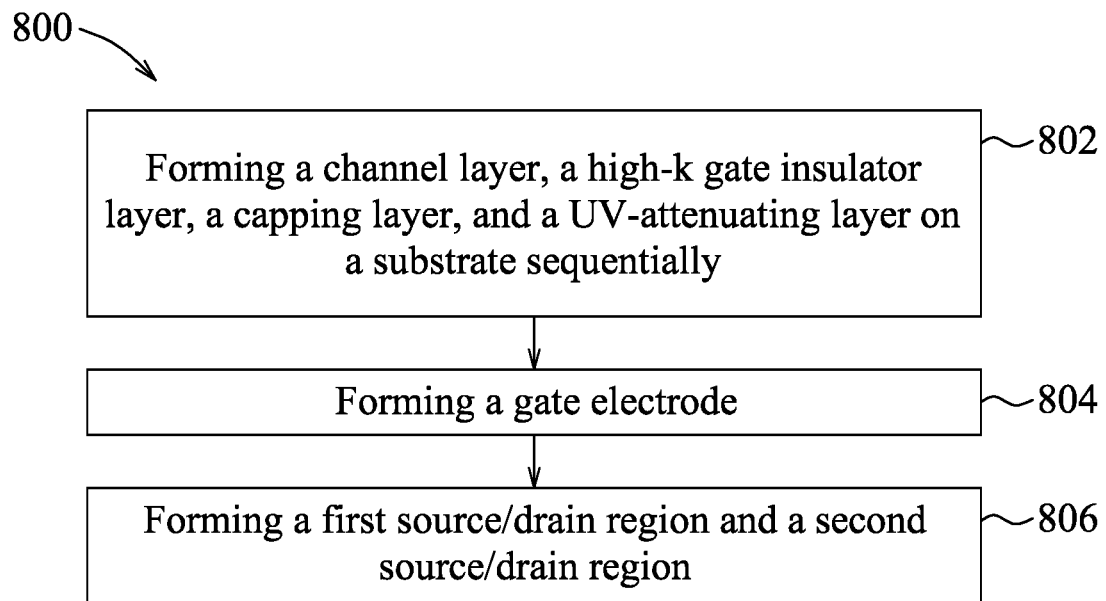
FIG. 33 is a flow diagram illustrating a method for manufacturing the transistor device as depicted in FIG. 32.

FIG. 33 illustrates a method 800 for manufacturing the transistor device 8 in accordance with some embodiments. Additional steps can be provided before, after or during the method 800, and some of the steps described herein may be replaced by other steps or be eliminated. Similarly, further additional features may be present in the transistor device 8, and/or features present may be replaced or eliminated in additional embodiments.

Figure 34:
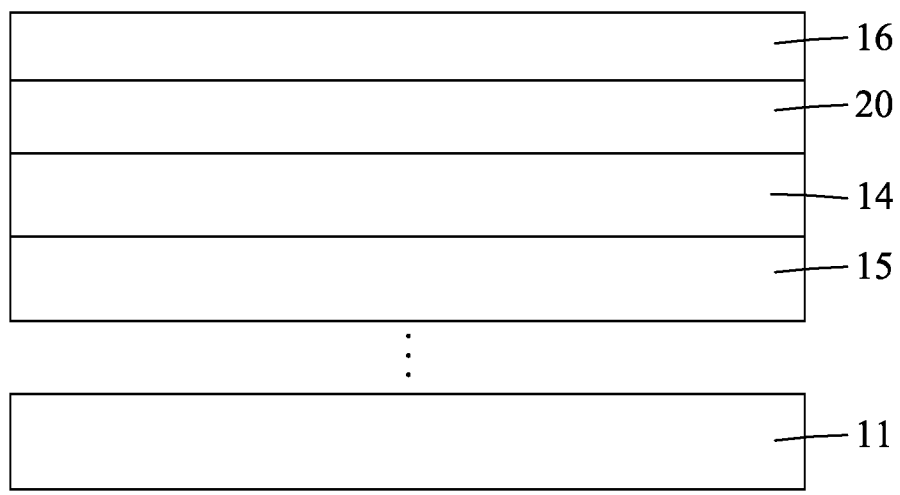
FIG. 34 illustrates a schematic view showing an intermediate stage of the method as depicted in FIG. 33.

Referring to FIG. 33, the method 800 begins at block 802, where a channel layer, a high-k gate insulator layer, a capping layer, and a UV-attenuating layer are deposited on a substrate sequentially. Referring to the example illustrated in FIG. 34, the channel layer 15, the high-k gate insulator layer 14, the capping layer 20, and the UV-attenuating layer 16 are deposited on the substrate 11 sequentially. Details regarding the materials and the deposition of the channel layer 15, the high-k gate insulator layer 14, the capping layer 20, and the UV-attenuating layer 16 are the same as or similar to those described above with respect to the transistor device 4.

Referring to FIG. 33, the method 800 then proceeds to blocks 804 and 806, where a gate electrode, and first and second source/drain regions are formed, respectively. Details regarding the materials and the formation of the gate electrode 13 and the first and second source/drain regions 17, 17' are similar to those described above with respect to the transistor device 3.

Figure 35:
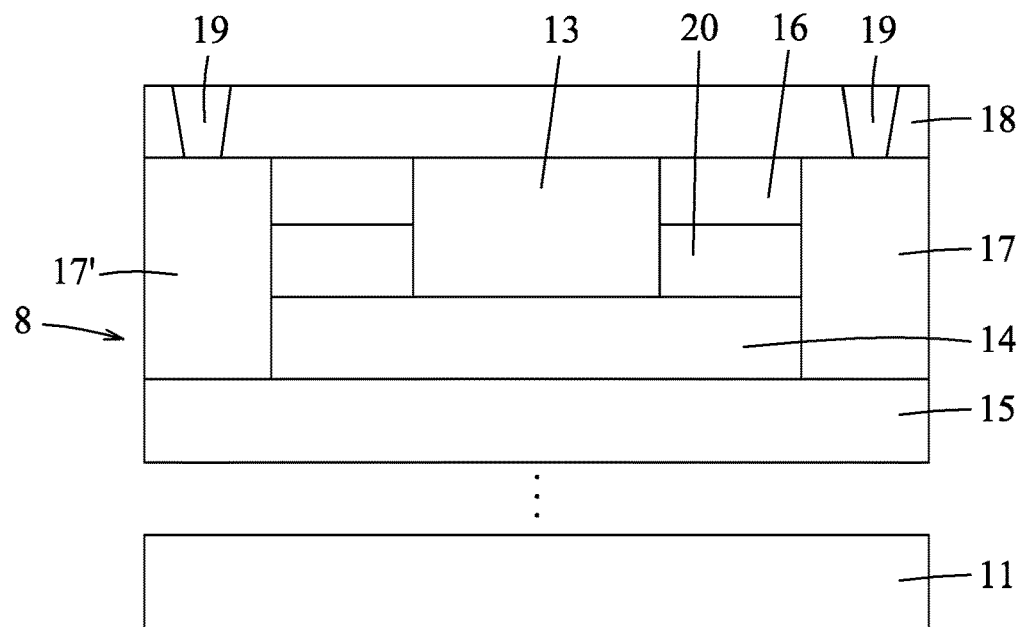
FIG. 35 illustrates a schematic view showing an additional stage for further processing the transistor device as depicted in FIG. 32.

Referring to the example illustrated in FIG. 35, an IMD layer 18 is formed on the first and second source/drain regions 17, 17', the gate electrode 13, and the UV-attenuating layer 16, and source/drain via contacts 19 are formed in the IMD layer 18 to be in contact with the first and second source/drain regions 17, 17', respectively. Details regarding the materials and the formation of the IMD layer 18 and the source/drain via contacts 19 are the same as or similar to those described above with respect to the transistor device 1.

Figure 36:
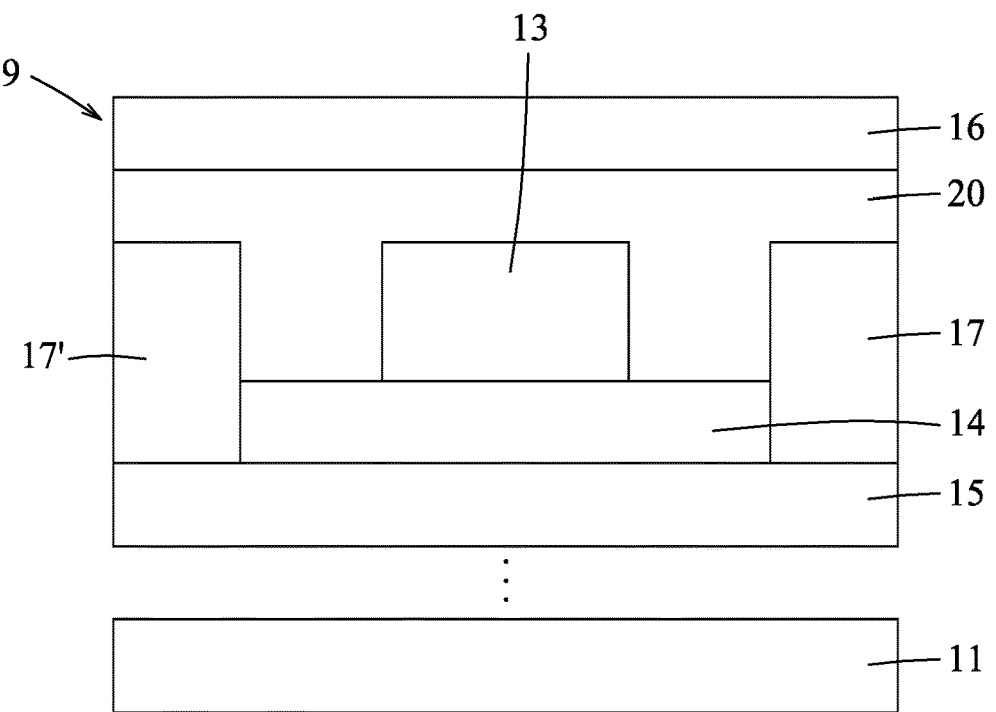
FIG. 36 illustrates a schematic view of a transistor device in accordance with some embodiments.

FIG. 36 illustrates a schematic view of a transistor device in accordance with some embodiments. A transistor device 9 is disposed on a substrate 11 and is a TFT device having a front gate configuration. The transistor device 9 includes a channel layer 15, a high-k gate insulator layer 14, a capping layer 20, a UV-attenuating layer 16, a gate electrode 13, a first source/drain region 17, and a second source/drain region 17'. The channel layer 15 is formed on the substrate 11. The high-k gate insulator layer 14 is formed on the channel layer 15. The gate electrode 13 is formed on the high-k gate insulator layer 14. The first and second source/drain regions 17, 17' are formed on the channel layer 15. The capping layer 20 is formed on the high-k gate insulator layer 14, and covers the gate electrode 13 and the first and second source/drain regions 17, 17'. The UV-attenuating layer 16 is formed on the capping layer 20. The channel layer 15 is electrically connected to the first and second source/drain regions 17, 17'.

Figure 37:
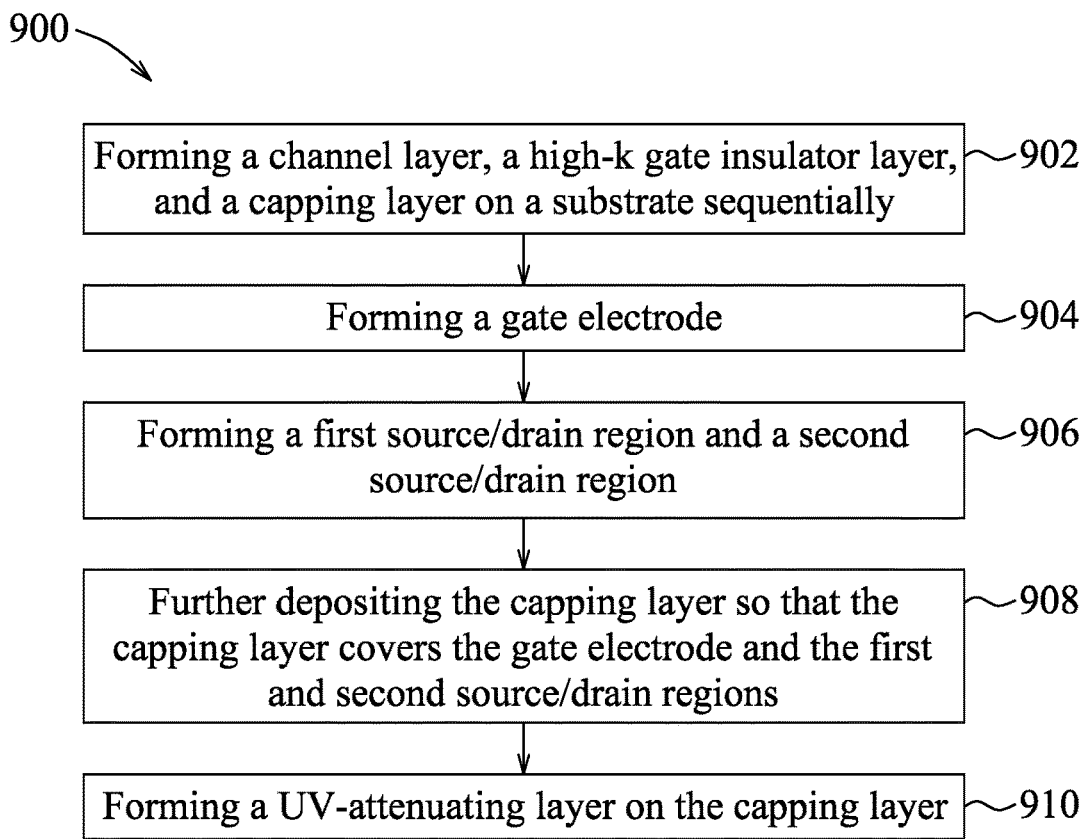
FIG. 37 is a flow diagram illustrating a method for manufacturing the transistor device as depicted in FIG. 36.

FIG. 37 illustrates a method 900 for manufacturing the transistor device 9 in accordance with some embodiments. Additional steps can be provided before, after or during the method 900, and some of the steps described herein may be replaced by other steps or be eliminated. Similarly, further additional features may be present in the transistor device 9, and/or features present may be replaced or eliminated in additional embodiments.

Figure 38:
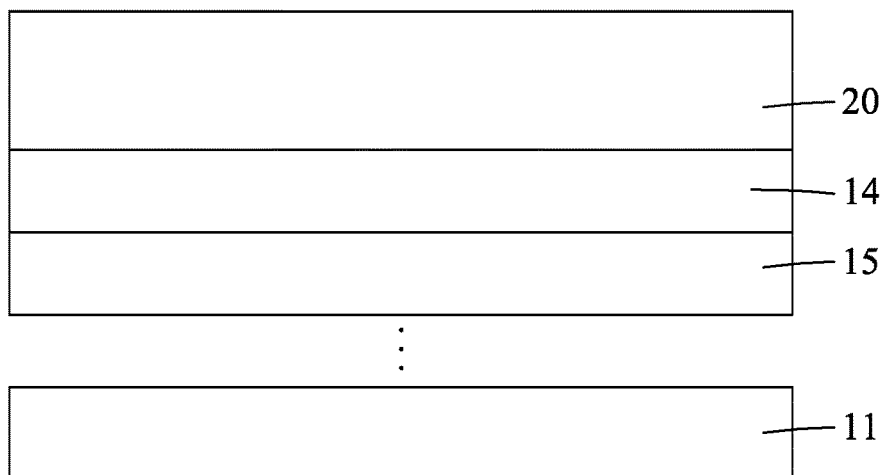
FIGS. 38 to 40 illustrate schematic views showing intermediate stages of the method as depicted in FIG. 37.

Referring to FIG. 37, the method 900 begins at block 902, where a channel layer, a high-k gate insulator layer, and a capping layer are deposited on a substrate sequentially. Referring to the example illustrated in FIG. 38, the channel layer 15, the high-k gate insulator layer 14, and the capping layer 20 are deposited on the substrate 11 sequentially. Details regarding the materials and the deposition of the channel layer 15, the high-k gate insulator layer 14, and the capping layer 20 are the same as or similar to those described above with respect to the transistor device 4.

Figure 39:
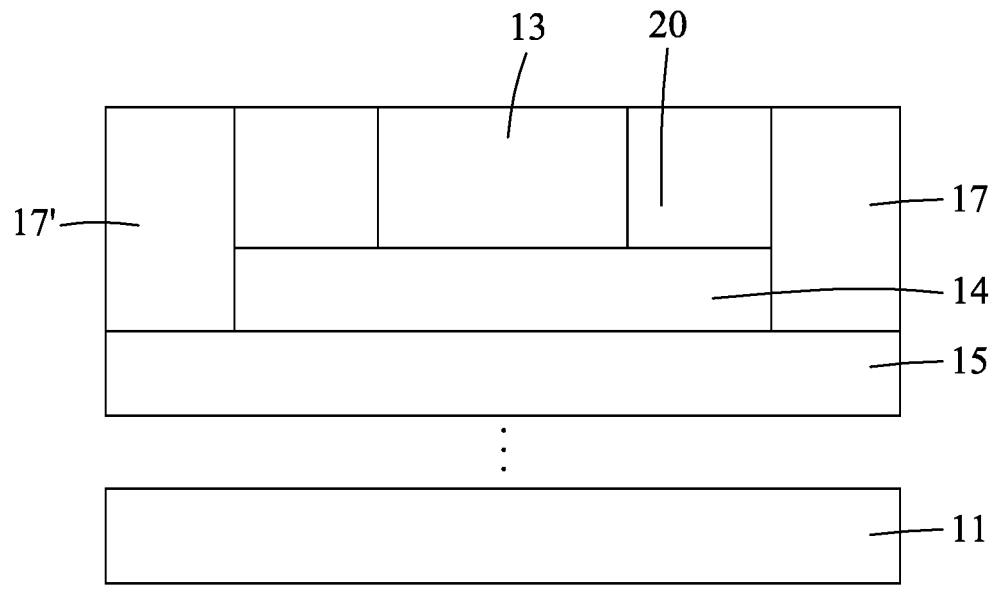

Referring to FIG. 37, the method 900 then proceeds to blocks 904 and 906, where a gate electrode and first and second source/drain regions are formed, respectively. Referring to the example illustrated in FIG. 39, the gate electrode 13 is formed on the high-k gate insulator layer 14 and the first and second source/drain regions 17, 17' are formed on the channel layer 15. Details regarding the materials and the formation of the gate electrode 13 and the first and second source/drain regions 17, 17' are similar to those described above with respect to the transistor device 3.

Figure 40:
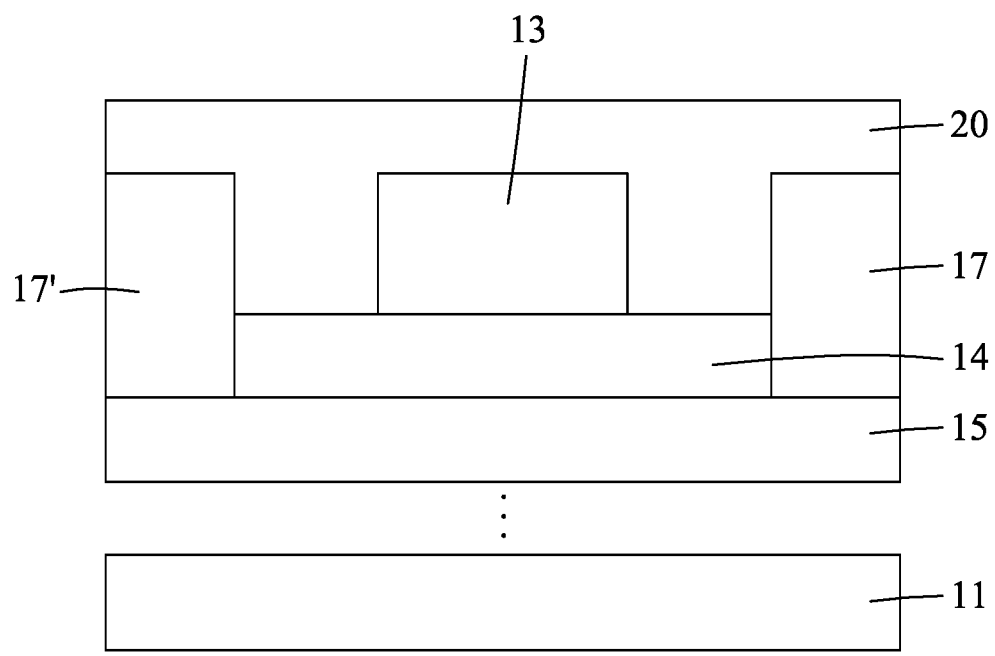

Referring to FIG. 37, the method 900 then proceeds to block 908, where a capping layer is further deposited to cover the gate electrode and the first and second source/drain regions. Referring to the example illustrated in FIG. 40, after the formation of the gate electrode 13 and the first and second source/drain regions 17, 17', the capping layer 20 is further deposited to cover the gate electrode 13 and the first and second source/drain regions 17, 17'.

Referring to FIG. 37, the method 900 then proceeds to block 910, where a UV-attenuating layer is formed on the capping layer. Referring to the example illustrated in FIG. 36, the UV-attenuating layer 16 is disposed on the capping layer 20.

Figure 41:
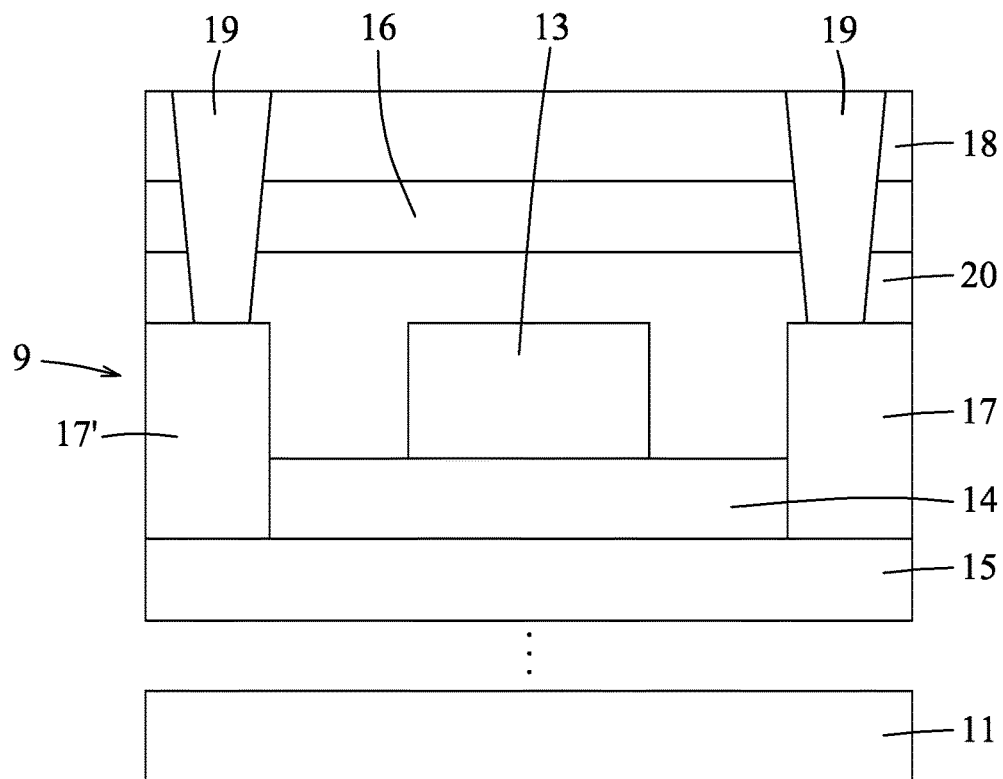
FIG. 41 illustrates a schematic view showing an additional stage for further processing the transistor device as depicted in FIG. 36.

Referring to the example illustrated in FIG. 41, an IMD layer 18 is formed on the UV-attenuating layer 16, and source/drain via contacts 19 are formed to penetrate through the IMD layer 18, the UV-attenuating layer 16, and the capping layer 20 to be in contact with the first and second source/drain regions 17, 17', respectively. Details regarding the materials and the formation of the IMD layer 18 and the source/drain via contacts 19 are the same as or similar to those described above with respect to the transistor device 1.

In the transistor devices 4, 5, 6, 7, 8, 9, the UV-attenuating layer 16 is made of the UV-attenuating material. Therefore, when the low-k dielectric material deposited over the UV-attenuating layer 16 is cured by the UV curing process to form the IMD layer 18, the UV-attenuating layer 16 may act as a shielding layer to protect the channel layer 15 formed below the UV-attenuating layer 16 from characteristic degradation which may be caused by the UV light used in the UV curing process. In addition, the capping layer 20 is formed on the channel layer 15, and can still be selected based on the preferred properties of the material of the channel layer 15 so as to protect the channel layer 15 from hydrogen atoms, which is known to damage the channel layer 15, generated during the manufacturing process of the transistor devices 4, 5, 6, 7, 8, 9.

Figure 42:
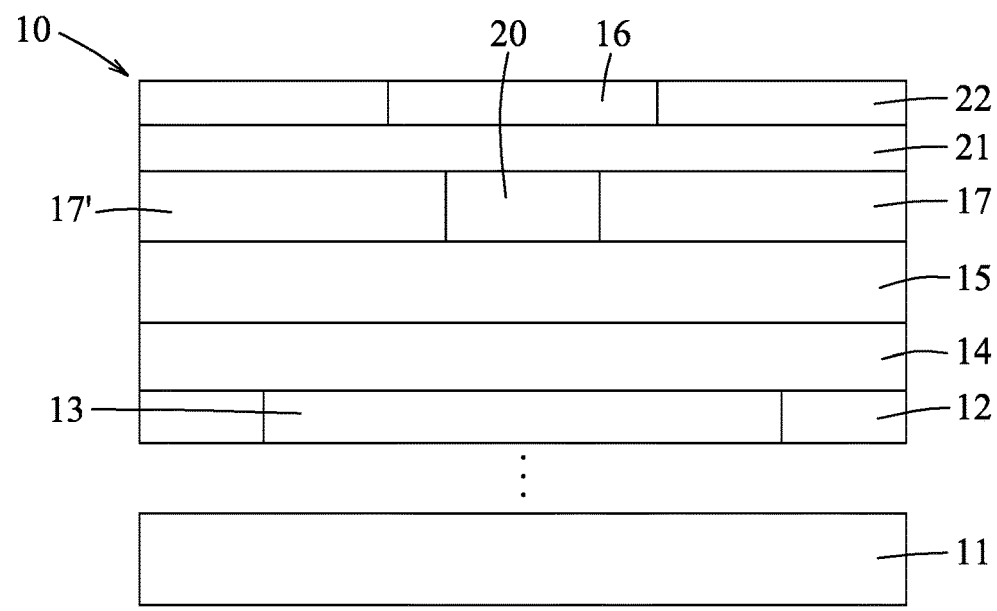
FIG. 42 illustrates a schematic view of a transistor device in accordance with some embodiments.

FIG. 42 illustrates a schematic view of a transistor device in accordance with some embodiments. A transistor device 10 is disposed on a substrate 11 and is a TFT device having a back gate configuration. The transistor device 10 includes a dielectric layer 12, a gate electrode 13, a high-k gate insulator layer 14, a channel layer 15, a capping layer 20, a first source/drain region 17, a second source/drain region 17', an etching stop layer 21, a dielectric layer 22, and a UV-attenuating layer 16. The dielectric layer 12 is formed on the substrate 11. The gate electrode 13 is formed in the dielectric layer 12 and on the substrate 11. The high-k gate insulator layer 14 is formed on the dielectric layer 12 and the gate electrode 13. The channel layer 15 is formed on the high-k gate insulator layer 14. The capping layer 20 is formed on the channel layer 15. The first and second source/drain regions 17, 17' are formed on the channel layer 15 and spaced apart from each other by the capping layer 20, and have top surfaces coplanar with a top surface of the capping layer 20. The etching stop layer 21 is formed on the capping layer 20 and the first and second source/drain regions 17, 17'. The dielectric layer 22 is formed on the etching stop layer 21. The UV-attenuating layer 16 is formed on the etching stop layer 21 and in the dielectric layer 22. The channel layer 15 is electrically connected to the first and second source/drain regions 17, 17'.

Figure 43:
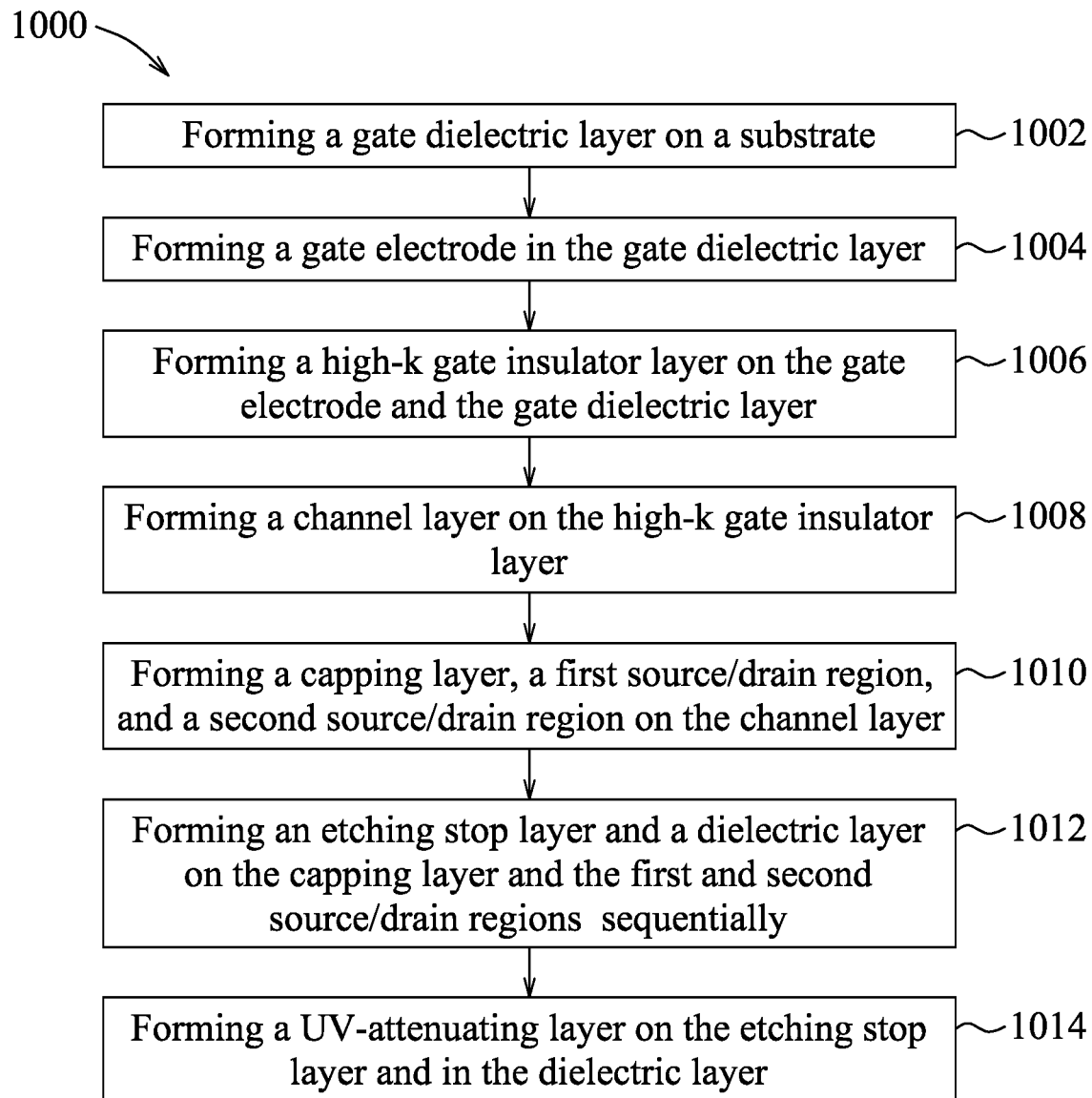
FIG. 43 is a flow diagram illustrating a method for manufacturing the transistor device as depicted in FIG. 42.

FIG. 43 illustrates a method 1000 for manufacturing the transistor device 10 in accordance with some embodiments. Additional steps can be provided before, after or during the method 1000, and some of the steps described herein may be replaced by other steps or be eliminated. Similarly, further additional features may be present in the transistor device 10, and/or features present may be replaced or eliminated in additional embodiments.

Figure 44:
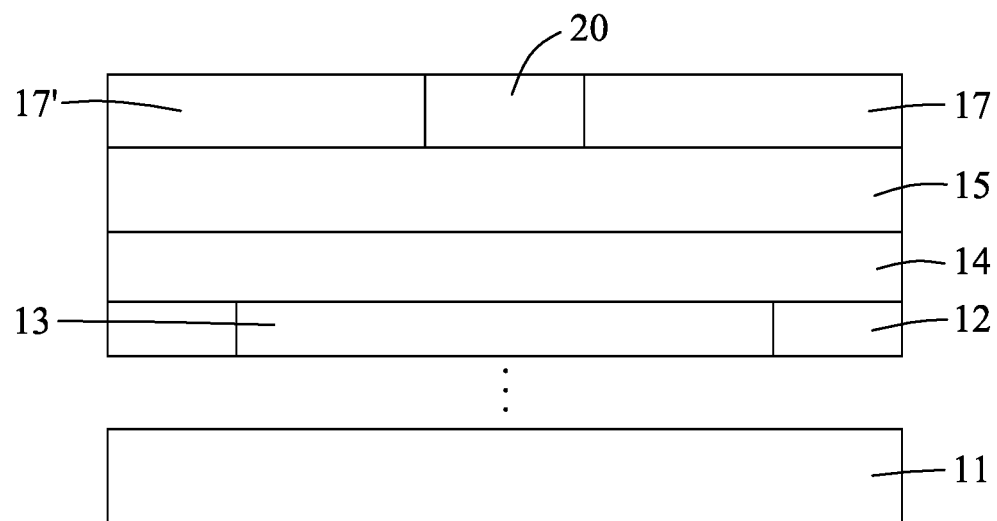
FIGS. 44 and 45 illustrate schematic views showing intermediate stages of the method as depicted in FIG. 43.

Referring to FIG. 43, the method 1000 begins at block 1002, where a dielectric layer is formed on a substrate, and then proceeds to blocks 1004, 1006, 1008, and 1010, where a gate electrode, a high-k gate insulator layer, a channel layer, and a capping layer and first and second source/drain regions are formed, respectively. Referring to the example illustrated in FIG. 44, the dielectric layer 12, the gate electrode 13, the high-k gate insulator layer 14, the channel layer 15, the capping layer 20, and the first and second source/drain regions 17, 17' are formed. Details regarding the materials and the formation of the dielectric layer 12, the gate electrode 13, the high-k gate insulator layer 14, the channel layer 15, the capping layer 20, and the first and second source/drain regions 17, 17' are the same as or similar to those described above with respect to the transistor device 4.

Figure 45:
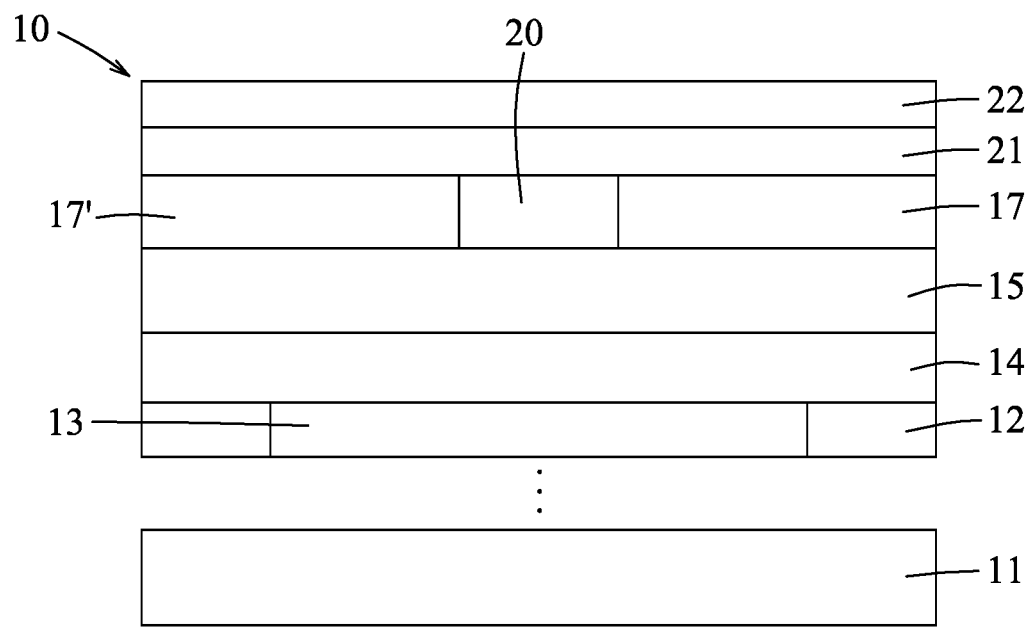

Referring to FIG. 43, the method 1000 then proceeds to block 1012, where an etching stop layer and a dielectric layer are sequentially deposited on the capping layer and the first and second source/drain regions. Referring to the example illustrated in FIG. 45, the etching stop layer 21 and the dielectric layer 22 are sequentially formed on the capping layer 20 and the first and second source/drain regions 17, 17'. In some embodiments, the etching stop layer 21 may include, for example but not limited to, aluminum compounds (for example, aluminum nitride, aluminum oxynitride, aluminum oxide, etc.), silicon compounds (for example, silicon oxide, silicon oxycarbide, silicon oxynitride, silicon carbonitride, silicon oxycarbonitride (SiCON), etc.), or combinations thereof. Details regarding the material of the dielectric layer 22 are the same as or similar to those described above for the dielectric layer 12 of the transistor device 1. Deposition of the etching stop layer 21 and the dielectric layer 22 may be performed by a suitable technique, CVD, PECVD, ALD, or other suitable processes.

Referring to FIG. 43, the method 1000 then proceeds to block 1014, where a UV-attenuating layer is formed in the dielectric layer. Referring to the example illustrated in FIG. 42, the dielectric layer 22 is patterned by an etching technique through a patterned photoresist (not shown) to form an opening to expose a portion of the etching stop layer 21. The etching technique includes wet etching, dry etching, or a combination thereof. The UV-attenuating layer 16 is then formed in the dielectric layer 22 and on the etching stop layer 21 by depositing a metal material to fill the opening and removing excess of the metal material by a planarization technique, such as CMP. In some embodiments, the UV-attenuating layer 16 is formed in a structure such as a metal sheet, a metal mesh, a metal line, or the like. The metal material may include, for example but not limited to, aluminum, copper, zirconium, titanium, tungsten, tantalum, ruthenium, palladium, platinum, cobalt, nickel, or alloys thereof.

Figure 46:
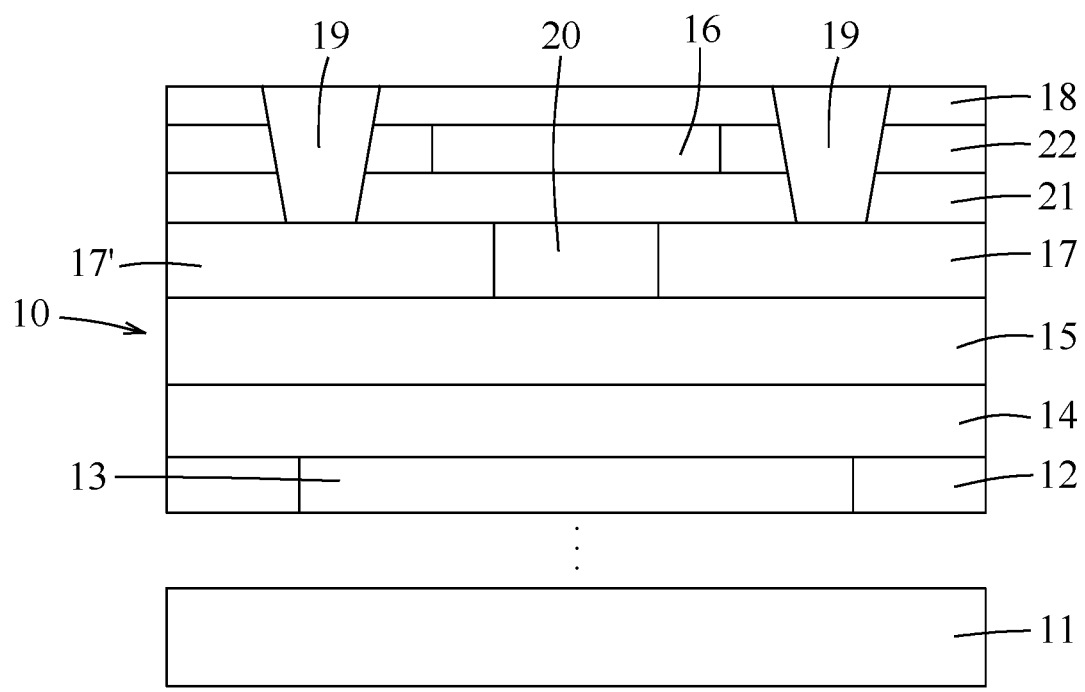
FIG. 46 illustrates a schematic view showing an additional stage for further processing the transistor device as depicted in FIG. 42.

Referring to the example illustrated in FIG. 46, an IMD layer 18 is formed on the UV-attenuating layer 16 and the dielectric layer 22, and source/drain via contacts 19 are formed to penetrate through the IMD layer 18, the dielectric layer 22, and the etching stop layer 21 so as to be in contact with the first and second source/drain regions 17, 17', respectively. Details regarding the materials and the formation of the IMD layer 18 and the source/drain via contacts 19 are the same as or similar to those described above with respect to the transistor device 1.

In the transistor device 10, the UV-attenuating layer 16 is made of the metal material and is formed to have a structure such as a metal sheet, a metal mesh, a metal line, or the like. Therefore, when the low-k dielectric material deposited over the UV-attenuating layer 16 is cured by the UV curing process to form the IMD layer 18, the UV-attenuating layer 16 may act as a shielding layer to protect the channel layer 15 formed below the UV-attenuating layer 16 from characteristic degradation which may be caused by the UV light used in the UV curing process. In addition, the capping layer 20 is formed to be in direct contact with the channel layer 15, and can still be selected based on the preferred properties of the material of the channel layer 15 so as to protect the channel layer 15 from hydrogen atoms, which is known to damage the channel layer 15, generated during the manufacturing process of the transistor device 10.

Figure 47:
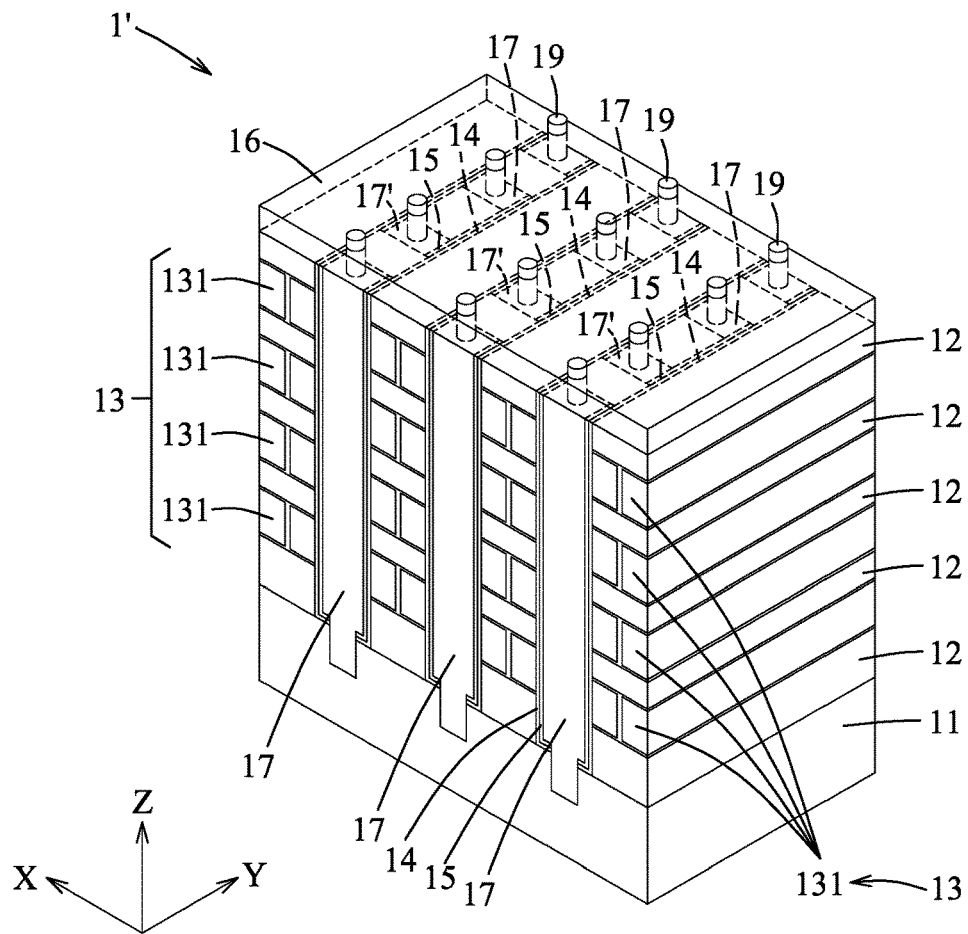
FIG. 47 illustrates a schematic perspective view of a transistor device in accordance with some embodiments.
Figure 48:
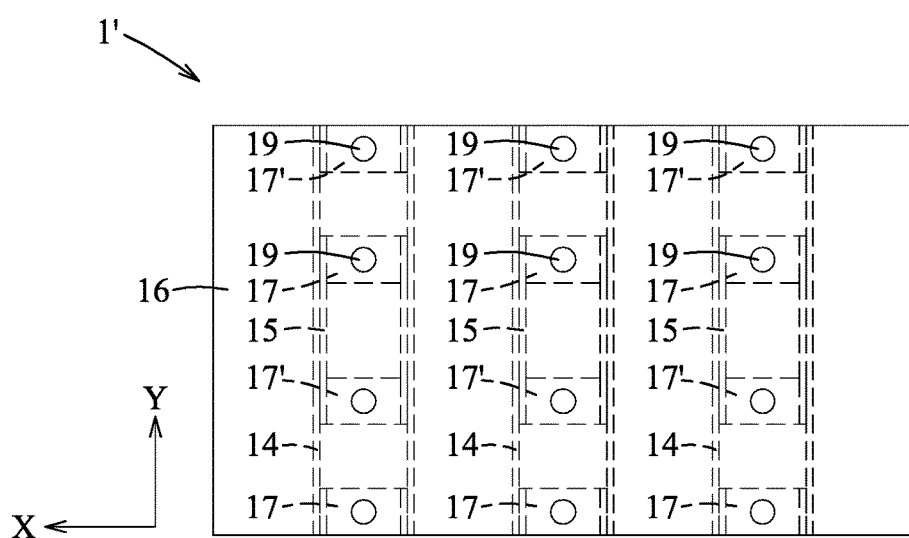
FIG. 48 illustrates a schematic top view of the transistor device as depicted in in FIG. 47.

FIG. 47 illustrates a schematic perspective view of a transistor device in accordance with some embodiments and FIG. 48 illustrates a top view of the transistor device. A transistor device 1' is disposed on a substrate 11, and includes an array of source/drain regions 17, 17', a plurality of gate electrodes 13, a plurality of high-k gate insulator layers 14, a plurality of channel layers 15, and a UV-attenuating layer 16. The array of the source/drain regions 17, 17' is formed on the substrate 11. Each column of the array of the source/drain regions 17, 17' includes a plurality of first source/drain regions 17 and a plurality of second source/drain region 17' alternatingly arranged with the first source/drain regions 17. Two adjacent gate electrodes 13 are spaced apart from each other by a corresponding column of the array of the source/drain regions 17, 17' in a first direction (X). Each of the gate electrodes 13 includes a plurality of gate regions 131 which extend in a second direction (Y) transverse to the first direction (X) and which alternate with a plurality of dielectric layers 12 in a third direction (Z) (i.e., an up-down direction) transverse to the first and second directions (X, Y). Each of the source/drain regions 17, 17' extends in the third direction (Z). Each of the high-k gate insulator layers 14 laterally covers a corresponding one of the gate electrodes 13. Each of the channel layers 15 is electrically connected to one of the first source/drain regions 17 and a corresponding one of the second source/drain regions 17' in a corresponding column of the array of the source/drain regions 17, 17', and is laterally disposed on a corresponding one of the high-k gate insulator layers 14. In addition, each of the channel layers 15 is disposed between the corresponding ones of the first and second source/drain regions 17, 17' and the corresponding one of the high-k gate insulator layers 14. The UV-attenuating layer 16 is formed over the first and second source/drain regions 17, 17', the gate electrodes 13, the high-k gate insulator layers 14, and the channel layers 15, and acts as an IMD layer for forming a plurality of source/drain via contacts 19 therein to be in direct contact with the first and second source/drain regions 17, 17', respectively. In some embodiments, the UV-attenuating layer 16 may include, for example but not limited to, SiN.

Figure 49:
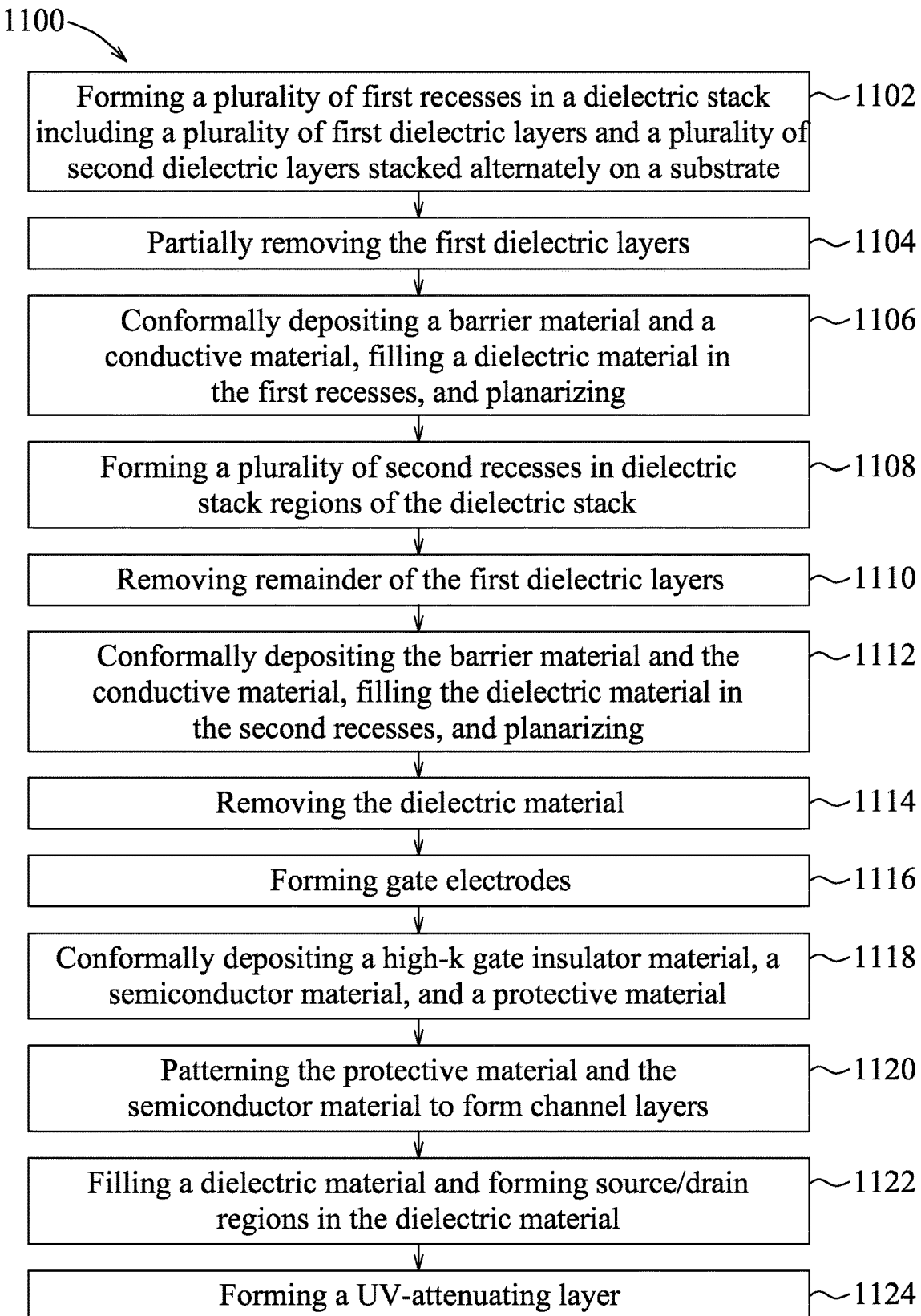
FIG. 49 is a flow diagram illustrating a method for manufacturing the transistor device as depicted in FIG. 47.

FIG. 49 illustrates a method 1100 for manufacturing the transistor device 1' in accordance with some embodiments. Additional steps can be provided before, after or during the method 1100, and some of the steps described herein may be replaced by other steps or be eliminated. Similarly, further additional features may be present in the transistor device 1', and/or features present may be replaced or eliminated in additional embodiments.

Figure 50:
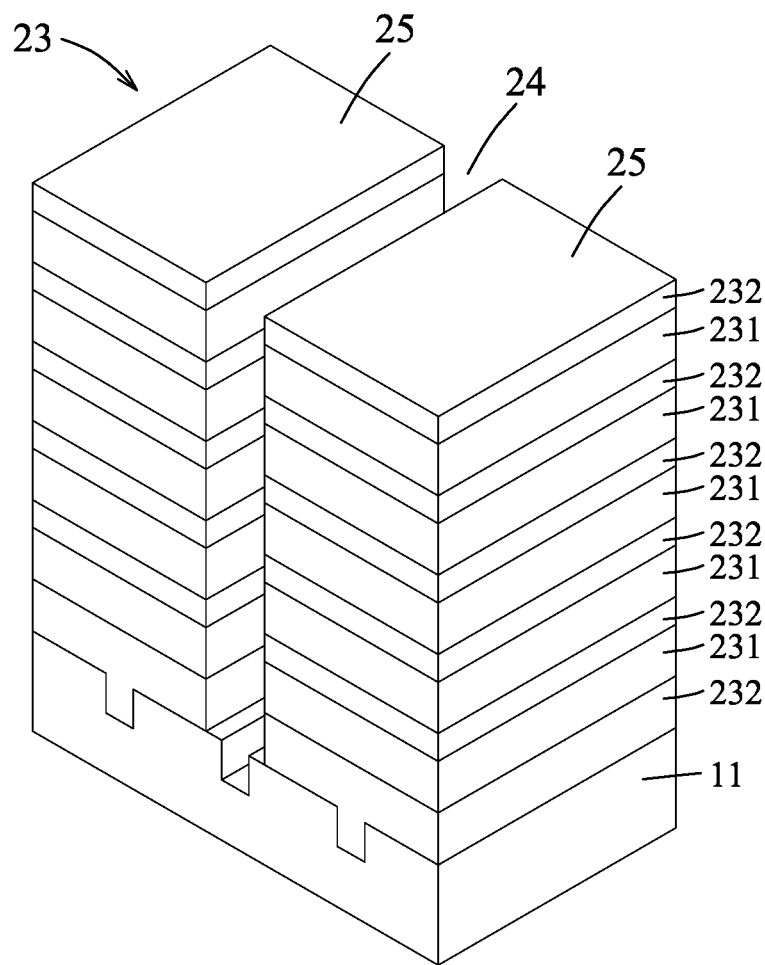
FIGS. 50 to 60 illustrate schematic perspective views showing intermediate stages of the method as depicted in FIG. 49.

Referring to FIG. 49, the method 1100 begins at block 1102, where a plurality of first recesses are formed in a dielectric stack. Referring to the example illustrated in FIG. 50, a dielectric stack 23 formed on a substrate 11 is recessed by an anisotropic etching process to form a plurality of first recesses 24 and a plurality of dielectric stack regions 25. Adjacent two of the dielectric stack regions 25 are spaced apart from each other by a corresponding one of the first recesses 24. The dielectric stack 23 includes a plurality of first dielectric layers 231 and a plurality of second dielectric layers 232, which are alternately stacked on the substrate 11. Details regarding the material of the substrate 11 are the same as or similar to those described above with respect to the transistor device 1. In some embodiments, the first dielectric layers 231 may include, for example but not limited to, SiN, and the second dielectric layers 232 may include, for example but not limited to, silicon oxide (SiO2). The anisotropic etching process may be a suitable anisotropic etching process, for example but not limited to, anisotropic dry etching.

Figure 51:
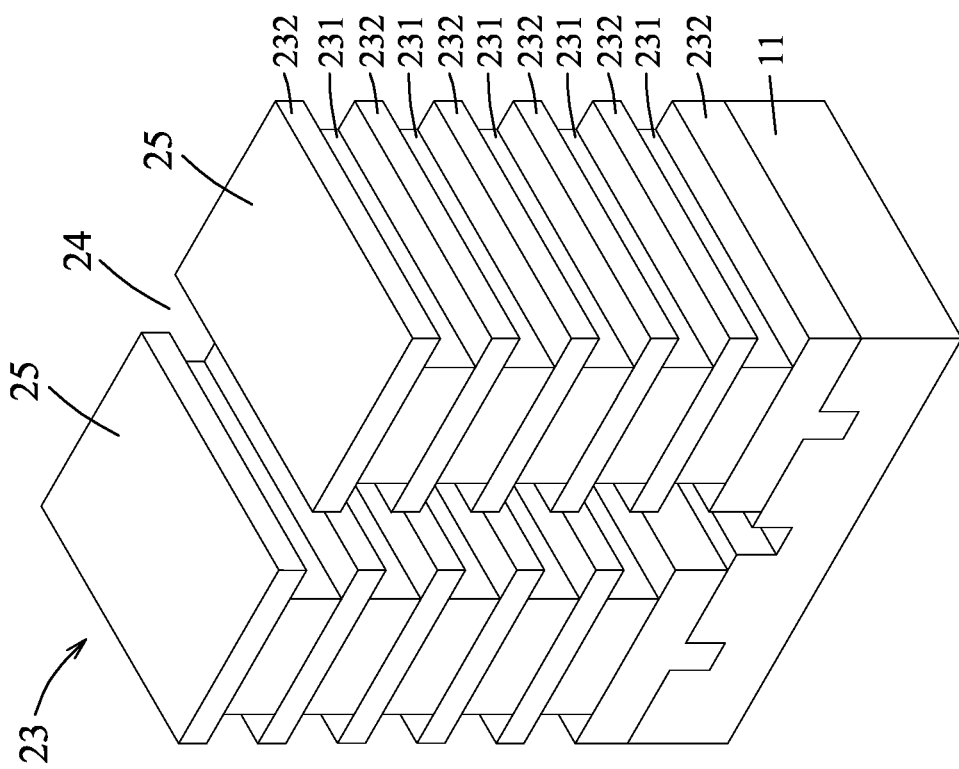

Referring to FIG. 49, the method 1100 proceeds to block 1104, where the first dielectric layers are partially removed. Referring to the example illustrated in FIG. 51, the first dielectric layers 231 are laterally recessed by an isotropic etching process to remove side portions of the first dielectric layers 231 based on a relatively high etching selectivity of the first dielectric layers 231 with respect to the second dielectric layers 232.

Figure 52:
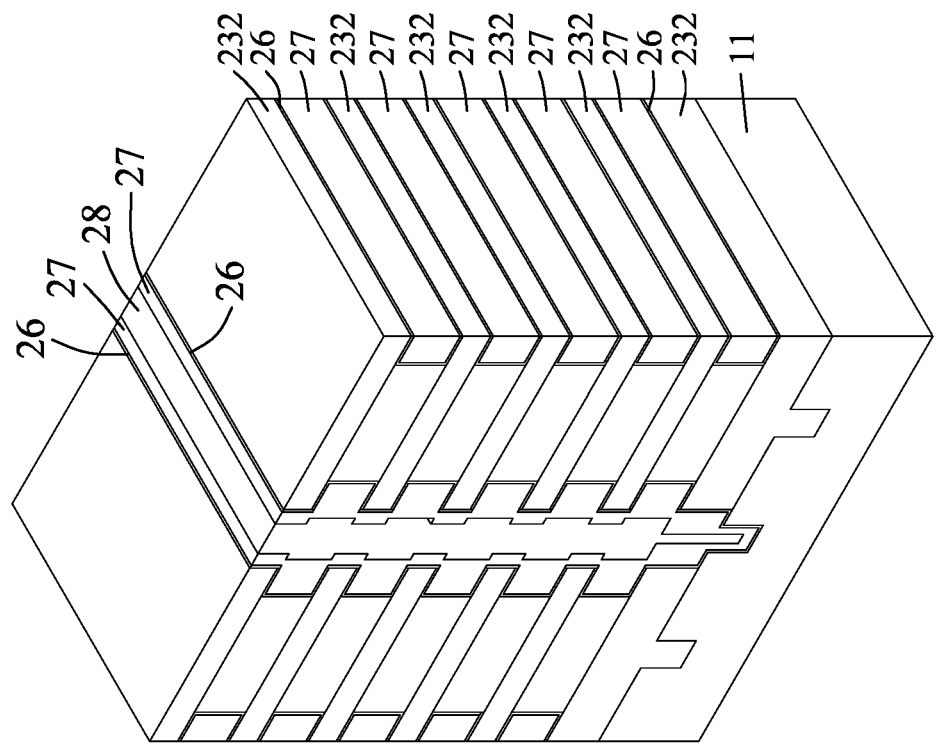

Referring to FIG. 49, the method 1100 proceeds to block 1106, where a barrier material and a conductive material are conformally deposited on the dielectric stack regions, a dielectric material is filled in the first recesses, and a planarization is conducted. Referring to the examples illustrated in FIGS. 51 and 52, a barrier material and a conductive material are conformally deposited on the dielectric stack regions 25 sequentially, a dielectric material is filled in the first recesses 24, and a planarization, such as CMP is conducted, so as to form a plurality of barrier layers 26 conformally and laterally deposited on the dielectric stack regions 25, a plurality of conductive layers 27 conformally and laterally deposited on the barrier layers 26, and a plurality of dielectric regions 28 formed in receiving spaces defined by the conductive layers 27. In some embodiments, the barrier material may include, for example but not limited to, titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), or a combination thereof. The conductive material may include, for example but not limited to, aluminum, zirconium, titanium, tungsten, tantalum, ruthenium, palladium, platinum, cobalt, nickel, or alloys thereof. The dielectric material may include, for example but not limited to, silicon oxide.

Figure 53:
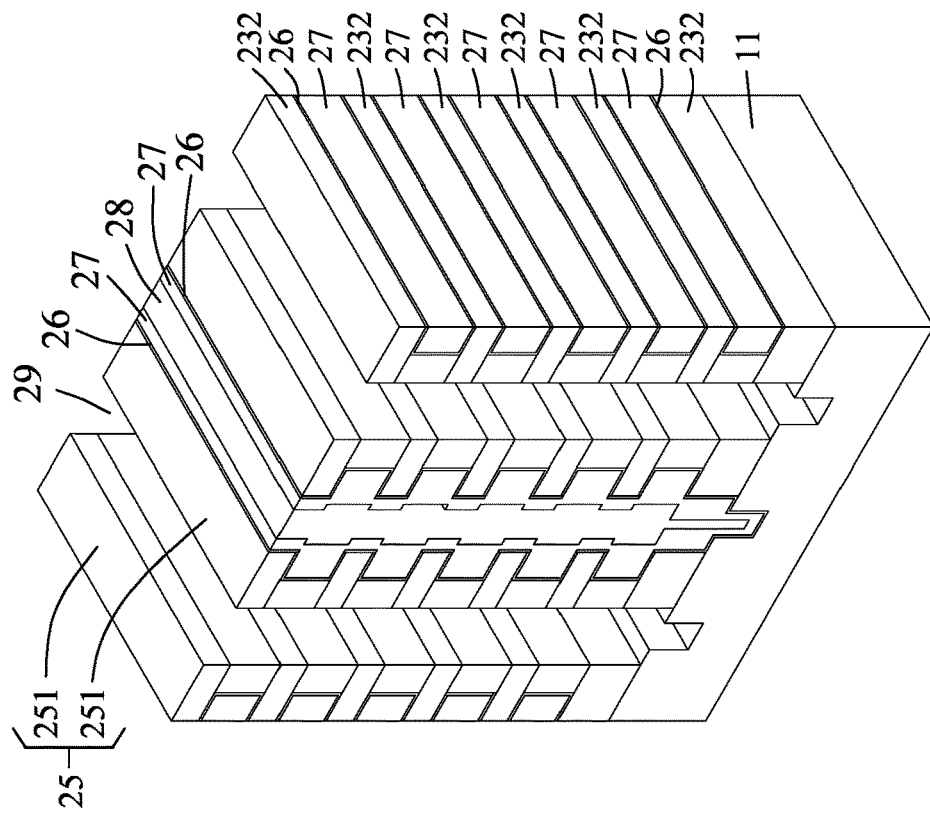

Referring to FIG. 49, the method 1100 proceeds to block 1108, where a plurality of second recesses are formed in the dielectric stack regions of the dielectric stack. Referring to the examples illustrated in FIGS. 52 and 53, the dielectric stack regions 25 are recessed by the anisotropic etching process to form a plurality of second recesses 29, each of which is defined by two dielectric stack sub-regions 251 of a corresponding one of the dielectric stack regions 25.

Figure 54:
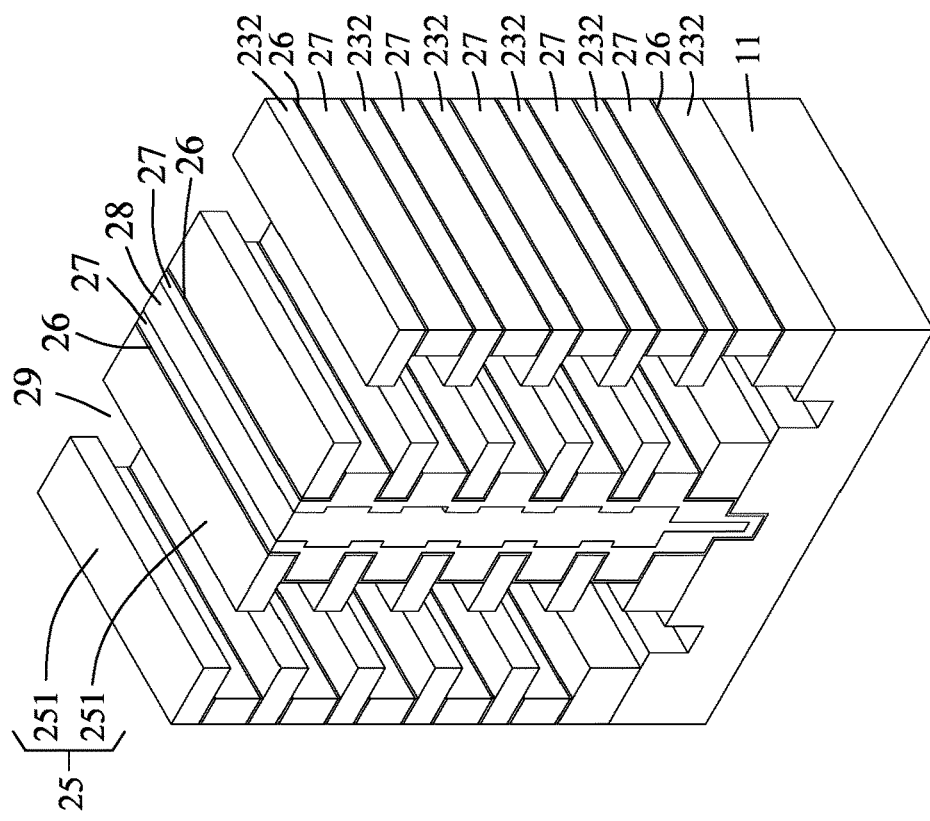

Referring to FIG. 49, the method 1100 proceeds to block 1110, where remainder of the first dielectric layers are removed. Referring to the examples illustrated in FIGS. 53 and 54, remainder of the first dielectric layers 231 are removed by the isotropic etching process based on a relatively high etching selectivity of the first dielectric layers 231 with respect to the second dielectric layers 232.

Figure 55:
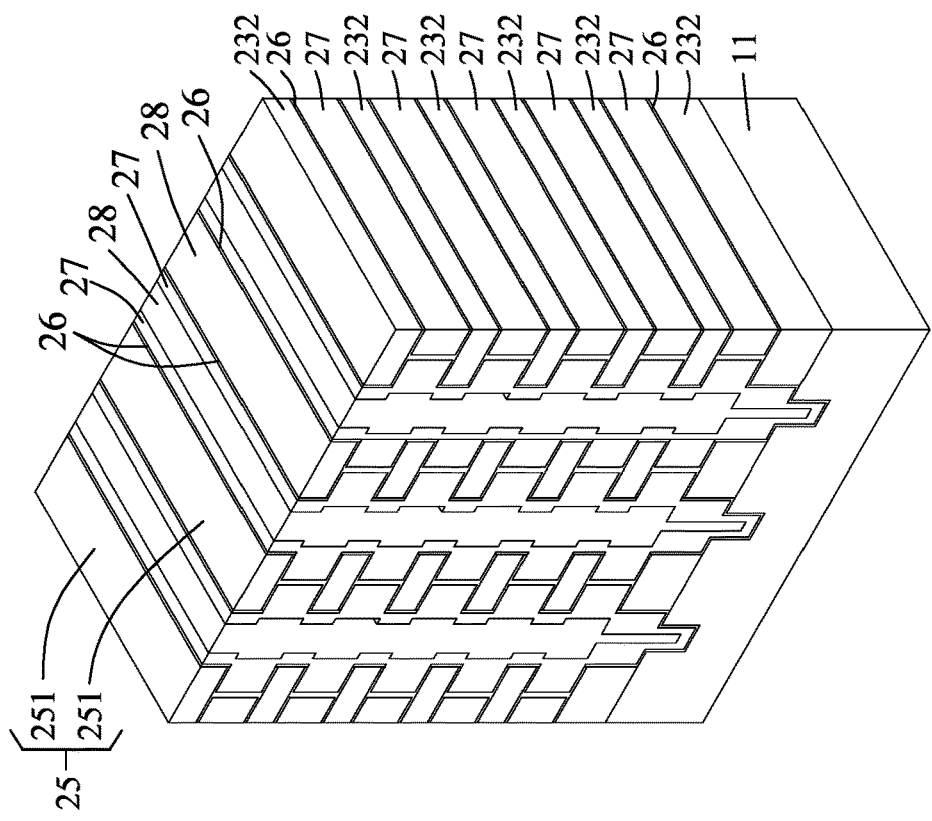

Referring to FIG. 49, the method 1100 proceeds to block 1112, where the barrier material and the conductive material are conformally deposited on the dielectric stack sub-regions of the dielectric stack regions, the dielectric material is filled in the second recesses, and the planarization is conducted. Referring to the examples illustrated in FIGS. 54 and 55, the barrier material and the conductive material are conformally deposited on the dielectric stack sub-regions 251 of the dielectric stack regions 25 sequentially, the dielectric material is filled in the second recesses 29, and the planarization, such as CMP, is conducted, so as to form a plurality of the barrier layers 26 conformally and laterally deposited on the dielectric stack sub-regions 251 of the dielectric stack regions 25, a plurality of the conductive layers 27 conformally and laterally deposited on the barrier layers 26, and a plurality of the dielectric regions 28 formed in receiving spaces defined by the conductive layers 27.

Figure 56:
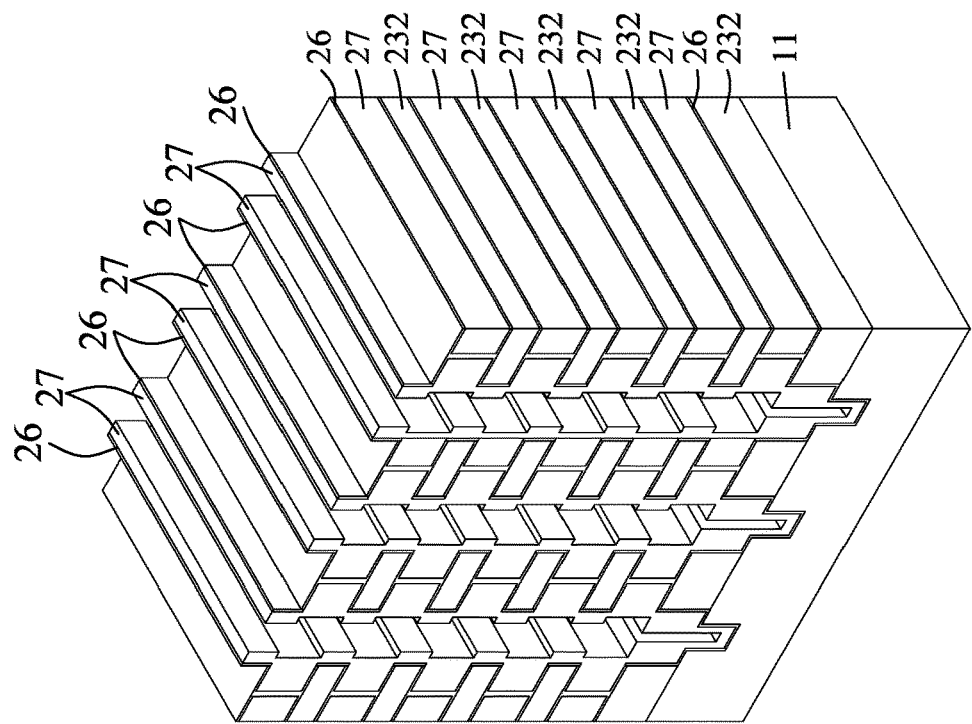

Referring to FIG. 49, the method 1100 proceeds to block 1114, where the dielectric material is removed. Referring to the examples illustrated in FIGS. 55 and 56, the dielectric regions 28 and the top ones of the second dielectric layers 232 are removed by the isotropic etching process to expose the conductive layers 27.

Figure 57:
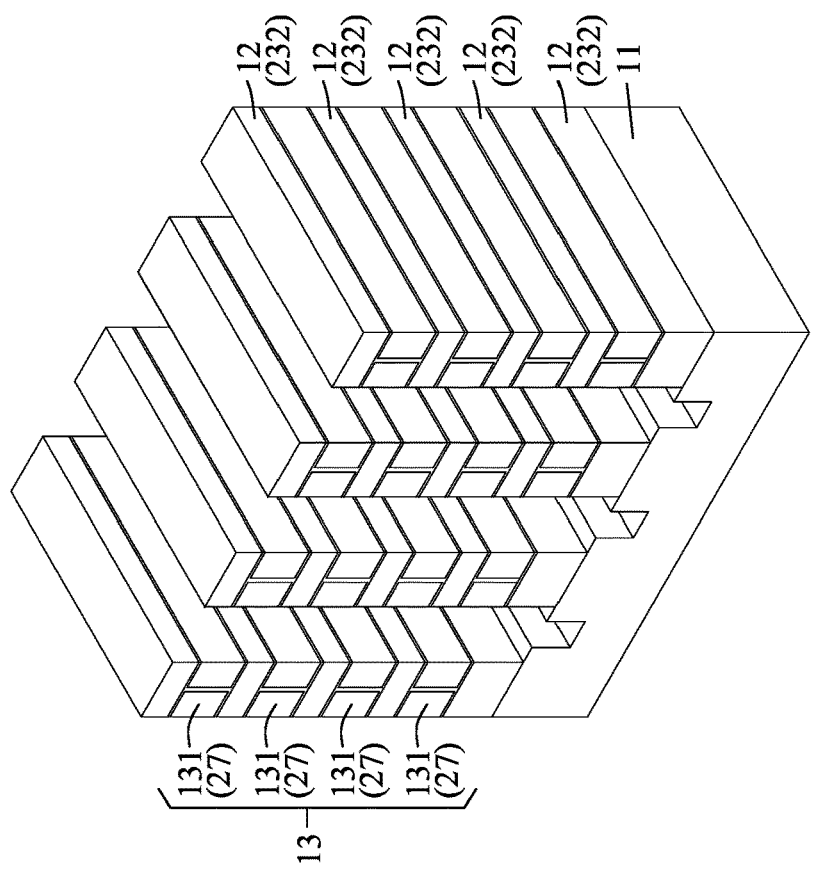

Referring to FIG. 49, the method 1100 proceeds to block 1116, where gate electrodes are formed. Referring to the examples illustrated in FIGS. 56 and 57, the conductive layers 27 are etched back by the anisotropic etching process to form the electrode gates 13 each of which includes a plurality of the gate regions 131 alternating with the dielectric layers 12 (see FIG. 47), which are made of the second dielectric layers 232.

Figure 58:
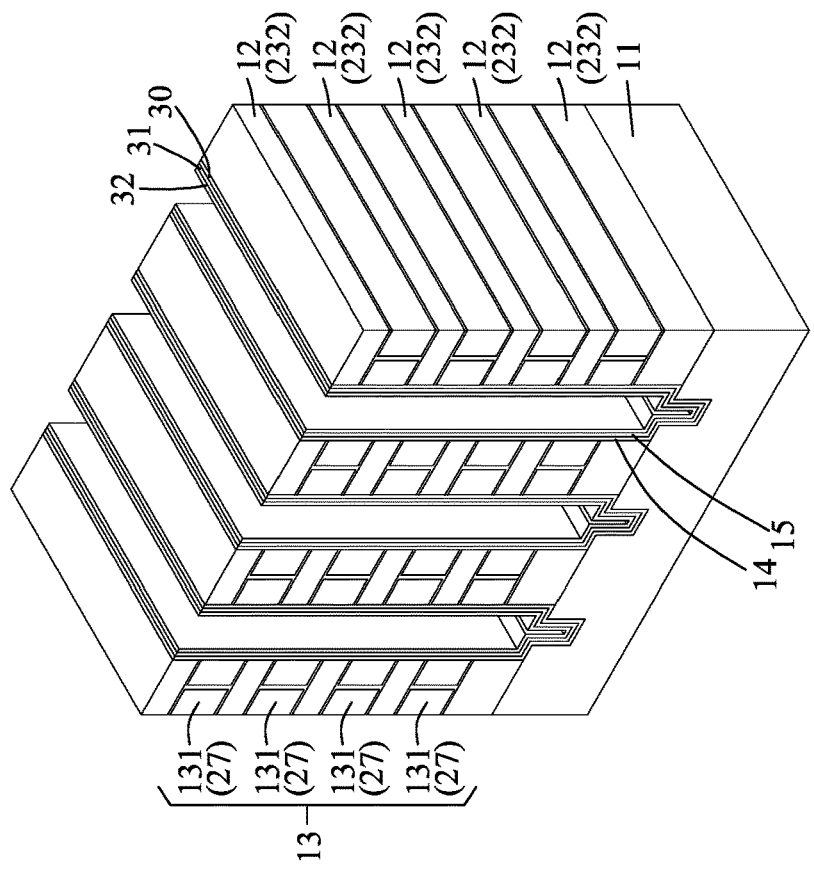

Referring to FIG. 49, the method 1100 proceeds to block 1118, where a high-k gate insulator material, a semiconductor material, and a protective material are conformally deposited. Referring to the examples illustrated in FIGS. 57 and 58, a high-k gate insulator material 30, a semiconductor material 31, and a protective material 32 are conformally deposited sequentially. Details regarding the materials of the high-k gate insulator material 30 and the semiconductor material 31 are the same as or similar to those described above with respect to the transistor device 1. In some embodiments, the protective material 32 may include, for example but not limited to, aluminum oxide (Al2O3).

Figure 59:
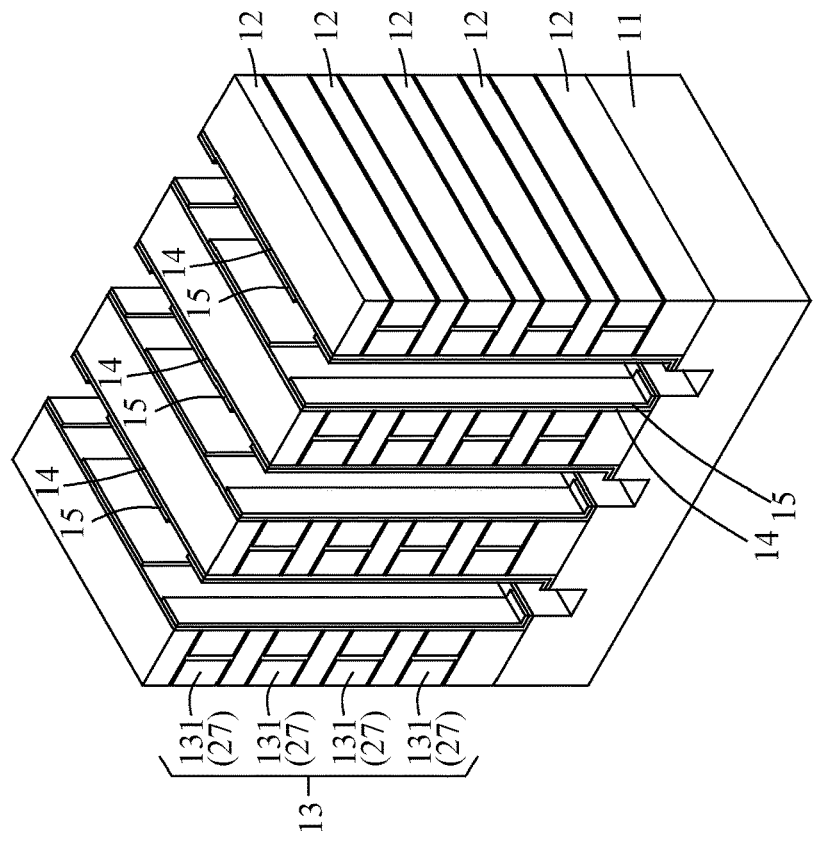

Referring to FIG. 49, the method 1100 proceeds to block 1120, where the protective material and the semiconductor material are patterned to form channel layers. Referring to the examples illustrated in FIGS. 58 and 59, the protective material 32 and the semiconductor material 31 are patterned by an etching technique to form the channel layers 15 (see FIG. 47) which are made of the semiconductor material 31 and which are laterally disposed on the high-k gate insulator layers 14 (see FIG. 47) made of the high-k gate insulator material 30.

Figure 60:
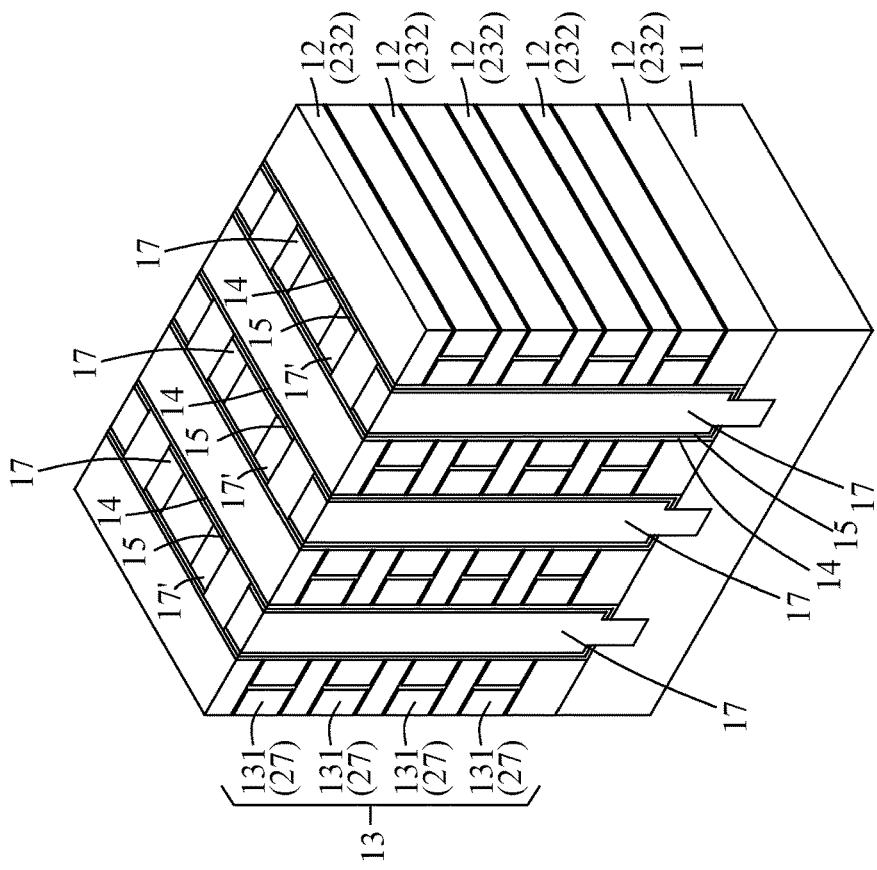

Referring to FIG. 49, the method 1100 proceeds to block 1122, where the dielectric material is filled and source/drain regions are formed in the dielectric material. Referring to the examples illustrated in FIGS. 59 and 60, the dielectric material (for example but not limited to, silicon oxide) is filled in the recesses defined by the channel layers 15 and the high-k gate insulator layers 14, and is patterned by an etching technique through a patterned photoresist (not shown) to form openings. The source/drain regions 17, 17' (see FIG. 47) are formed by filling a semiconductor material in the openings and removing excesses of the semiconductor material by a planarization technique, such as CMP. Details regarding the semiconductor material are the same as or similar to those described above with respect to the transistor device 1.

Referring to FIG. 49, the method 1100 proceeds to block 1124, where a UV-attenuating layer is formed. Referring to the examples illustrated in FIG. 47, the UV-attenuating layer 16 is formed over the source/drain regions 17, 17', the channel layers 15, the high-k gate insulator layers 14, and the gate electrodes 13 by a suitable depositing technique. In some embodiments, the UV-attenuating layer 16 may include, for example but not limited to, SiN. The source/drain via contacts 19 are then formed in the UV-attenuating layer 16 to be in direct contact with the source/drain regions 17, 17', respectively.

In the transistor device 1', the UV-attenuating layer 16 is formed over the channel layers 15. Therefore, when a low-k dielectric material deposited over the UV-attenuating layer 16 is cured by the UV curing process to form an IMD layer (not shown) in the BEOL process, the UV-attenuating layer 16 may act as a shielding layer to protect the channel layer 15 formed below the UV-attenuating layer 16 from characteristic degradation which may be caused by the UV light used in the UV curing process. In addition, the UV-attenuating layer 16 in the transistor device 1' also acts as an IMD layer for forming the source/drain via contacts 19 therein to be in direct contact with the source/drain regions 17, 17', respectively.

In accordance with some embodiments of the present disclosure, a transistor device includes a first source/drain region and a second source/drain region spaced apart from each other; a channel layer electrically connected to the first and second source/drain regions; a gate insulator layer; a gate electrode isolated from the channel layer by the gate insulator layer; and a UV-attenuating layer disposed on the channel layer to protect the channel layer from characteristic degradation caused by UV light.

In accordance with some embodiments of the present disclosure, the UV-attenuating layer is in direct contact with the channel layer.

In accordance with some embodiments of the present disclosure, the UV-attenuating layer is isolated from the channel layer by the gate insulator layer.

In accordance with some embodiments of the present disclosure, the transistor device further includes a capping layer disposed on the channel layer.

In accordance with some embodiments of the present disclosure, the UV-attenuating layer is disposed on the capping layer.

In accordance with some embodiments of the present disclosure, the UV-attenuating layer is inserted in the capping layer.

In accordance with some embodiments of the present disclosure, the UV-attenuating layer includes molybdenum oxide, molybdenum-doped zinc oxide, silicon nitride, InGaZnO:N, or combinations thereof.

In accordance with some embodiments of the present disclosure, the transistor device further includes an etching stop layer formed on the capping layer to isolate the UV-attenuating layer from the capping layer.

In accordance with some embodiments of the present disclosure, the UV-attenuating layer is formed in a metal sheet, a metal mesh, a metal line, or combinations thereof.

In accordance with some embodiments of the present disclosure, the UV-attenuating layer includes aluminum, zirconium, titanium, tungsten, tantalum, ruthenium, palladium, platinum, cobalt, nickel, or alloys thereof.

In accordance with some embodiments of the present disclosure, the gate insulator layer laterally covers the gate electrode. The channel layer is laterally disposed on the gate insulator layer and disposed between the first and second source/drain regions and the gate insulator layer. The UV-attenuating layer is formed over the first and second source/drain regions, the gate electrode, the gate insulator layer, and the channel layer, and acts as an intermetal dielectric layer for forming a source/drain via contact therein.

In accordance with some embodiments of the present disclosure, the UV-attenuating layer includes silicon nitride.

In accordance with some embodiments of the present disclosure, a transistor device includes a channel layer; a first source/drain region and a second source/drain region disposed on and electrically connected to the channel layer; a gate insulator layer; a gate electrode isolated from the channel layer by the gate insulator layer; and a UV-attenuating layer disposed on the channel layer to protect the channel layer from characteristic degradation caused by UV light.

In accordance with some embodiments of the present disclosure, the UV-attenuating layer is disposed on and in direct contact with the channel layer.

In accordance with some embodiments of the present disclosure, the transistor device further includes a capping layer disposed on the channel layer to isolate the UV-attenuating layer from the channel layer.

In accordance with some embodiments of the present disclosure, the UV-attenuating layer includes molybdenum oxide, molybdenum-doped zinc oxide, silicon nitride, InGaZnO:N, or combinations thereof.

In accordance with some embodiments of the present disclosure, the transistor device further includes an etching stop layer formed on the capping layer to isolate the UV-attenuating layer from the capping layer.

In accordance with some embodiments of the present disclosure, the UV-attenuating layer is formed in a metal sheet, a metal mesh, a metal line, or combinations thereof.

In accordance with some embodiments of the present disclosure, a transistor device includes a gate insulator layer; a channel layer electrically connected to the first and second source/drain regions and laterally disposed on the gate insulator layer; a gate electrode laterally covered by the gate insulator layer and isolated from the channel layer by the gate insulator layer; and a UV-attenuating layer disposed over the first and second source/drain regions, the gate electrode, the gate insulator layer, and the channel layer to protect the channel layer from characteristic degradation caused by UV light and act as an intermetal dielectric layer for forming a source/drain via contact therein.

In accordance with some embodiments of the present disclosure, the UV-attenuating layer includes silicon nitride.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor device, comprising:
   a first source/drain region and a second source/drain region spaced apart from each other;
   a channel layer electrically connected to the first and second source/drain regions;
   a gate insulator layer;
   a gate electrode isolated from the channel layer by the gate insulator layer;

a UV-attenuating layer disposed on the channel layer to protect the channel layer from characteristic degradation caused by UV light; and a capping layer disposed on the channel layer, the UV-attenuating layer being inserted in the capping layer.

2. The transistor device according to claim 1, wherein the UV-attenuating layer includes molybdenum oxide, molybdenum-doped zinc oxide, silicon nitride, InGaZnO:N, or combinations thereof.

3. The transistor device according to claim 1, wherein the UV-attenuating layer is isolated from the channel layer by the capping layer.

4. The transistor device according to claim 1, wherein the UV-attenuating layer is isolated from the channel layer by the first source/drain region and the second source/drain region.

5. The transistor device according to claim 1, wherein the UV-attenuating layer is isolated from the channel layer by the capping layer, the first source/drain region, and the second source/drain region.

6. The transistor device according to claim 1, the UV-attenuating layer has a top surface, and the capping layer has a top surface coplanar with the top surface of the UV-attenuating layer.

7. The transistor device according to claim 1, wherein the UV-attenuating layer is isolated from the first source/drain region and the second source/drain region by the capping layer.

8. The transistor device according to claim 1, wherein the gate insulator layer is disposed on the channel layer opposite to the UV-attenuating layer.

9. The transistor device according to claim 1, wherein the gate electrode is disposed on the gate insulator layer opposite to the UV-attenuating layer.

10. A transistor device, comprising:
a channel layer;
a first source/drain region and a second source/drain region disposed on and electrically connected to the channel layer;
a gate insulator layer;
a gate electrode isolated from the channel layer by the gate insulator layer; and
a UV-attenuating layer disposed on and in direct contact with the channel layer to protect the channel layer from characteristic degradation caused by UV light.

11. The transistor device according to claim 10, wherein the UV-attenuating layer includes molybdenum oxide, molybdenum-doped zinc oxide, silicon nitride, InGaZnO:N, or combinations thereof.

12. The transistor device according to claim 10, wherein the first source/drain region and the second source/drain region are disposed on the UV-attenuating layer.

13. The transistor device according to claim 12, wherein the first source/drain region and the second source/drain region are spaced apart from each other by an opening so as to permit a portion of the UV-attenuating layer to expose from the opening.

14. The transistor device according to claim 10, wherein the first source/drain region and the second source/drain region are spaced apart from each other by the UV-attenuating layer.

15. The transistor device according to claim 14, wherein the UV-attenuating layer has a top surface, and each of the first source/drain region and the second source/drain region has a top surface coplanar with the top surface of the UV-attenuating layer.

16. The transistor device according to claim 10, wherein the gate insulator layer is disposed on the channel layer opposite to the UV-attenuating layer.

17. The transistor device according to claim 10, wherein the gate electrode is disposed on the gate insulator layer opposite to the UV-attenuating layer.

18. A transistor device, comprising:
a first source/drain region and a second source/drain region extending in an upward direction;
a gate insulator layer;
a channel layer electrically connected to the first and second source/drain regions and laterally disposed on the gate insulator layer;
a gate electrode laterally covered by the gate insulator layer and isolated from the channel layer by the gate insulator layer; and
a UV-attenuating layer disposed over the first and second source/drain regions, the gate electrode, the gate insulator layer, and the channel layer to protect the channel layer from characteristic degradation caused by UV light and act as an intermetal dielectric layer for forming a source/drain via contact therein, the UV-attenuating layer being in direct contact with the channel layer.

19. The transistor device according to claim 18, wherein the UV-attenuating layer includes silicon nitride.

20. The transistor device according to claim 18, wherein the UV-attenuating layer is in direct contact with the first source/drain region and the second source/drain region.

* * * * *